US012445134B1

(12) United States Patent
Mathuriya et al.

(10) Patent No.: US 12,445,134 B1
(45) Date of Patent: Oct. 14, 2025

(54) DIODE CONNECTED NON-LINEAR INPUT CAPACITORS BASED MAJORITY GATE

(71) Applicant: Kepler Computing Inc., San Francisco, CA (US)

(72) Inventors: Amrita Mathuriya, Portland, OR (US); Rafael Rios, Austin, TX (US); Dmitri E. Nikonov, Beaverton, OR (US); Biswajeet Guha, Hillsboro, OR (US); Ikenna Odinaka, Durham, NC (US); Rajeev Kumar Dokania, Beaverton, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 33 days.

(21) Appl. No.: 18/391,438

(22) Filed: Dec. 20, 2023

(51) Int. Cl.
*H03K 19/23* (2006.01)
*H03K 19/185* (2006.01)

(52) U.S. Cl.
CPC ........... *H03K 19/23* (2013.01); *H03K 19/185* (2013.01)

(58) Field of Classification Search
CPC ............................ H03K 19/23; H03K 19/185
See application file for complete search history.

(56) References Cited

U.S. PATENT DOCUMENTS

| 3,108,193 A | 10/1963 | Schreiner |
| 3,260,863 A | 7/1966 | Burns et al. |
| 3,524,977 A | 8/1970 | Wang |
| 5,381,352 A | 1/1995 | Shou et al. |
| 5,818,380 A | 10/1998 | Ito et al. |
| 5,835,045 A | 11/1998 | Ogawa et al. |
| 5,926,057 A | 7/1999 | Ogawa et al. |
| 5,978,827 A | 11/1999 | Ichikawa |
| 6,043,675 A | 3/2000 | Miyamoto |
| 6,166,583 A | 12/2000 | Kochi et al. |
| 6,198,652 B1 | 3/2001 | Kawakubo et al. |
| 6,208,282 B1 | 3/2001 | Miyamoto |
| 7,837,110 B1 | 11/2010 | Hess et al. |

(Continued)

FOREIGN PATENT DOCUMENTS

| CN | 114362482 A | * 4/2022 | ......... H03K 19/0175 |
| JP | 2000156472 A | 6/2000 | |

(Continued)

OTHER PUBLICATIONS

"Kepler Logic", Named for Amalie Emmy Noether @ https://en.wikipedia.org/wiki/Emmy_Noether. Downloaded from internet on Jan. 10, 2020.

(Continued)

*Primary Examiner* — Seokjin Kim
(74) *Attorney, Agent, or Firm* — MUGHAL GAUDRY & FRANKLIN PC

(57) ABSTRACT

A logic gate includes a first capacitor to receive a first input, the first capacitor coupled to a node and a first diode structure coupled to the first input and the node. The logic gate future includes a second capacitor to receive a second input, the second capacitor coupled to the node and a second diode structure coupled to the second input and the node. The logic gate further includes a third capacitor to receive a third input, wherein the third capacitor is coupled to the node and a third diode structure coupled to the third input and the node.

20 Claims, 21 Drawing Sheets

(56) References Cited

U.S. PATENT DOCUMENTS

| | | | |
|---|---|---|---|
| 7,897,454 | B2 | 3/2011 | Wang et al. |
| 8,247,855 | B2 | 8/2012 | Summerfelt |
| 9,276,040 | B1 | 3/2016 | Marshall et al. |
| 9,305,929 | B1 | 4/2016 | Karda et al. |
| 9,324,405 | B2 | 4/2016 | Evans, Jr. et al. |
| 9,697,882 | B1 | 7/2017 | Evans, Jr. et al. |
| 9,858,979 | B1 | 1/2018 | Derner et al. |
| 9,973,329 | B2 | 5/2018 | Hood et al. |
| 10,217,522 | B2 | 2/2019 | Wang et al. |
| 10,446,214 | B1 | 10/2019 | Vincenzo et al. |
| 10,679,782 | B2 | 6/2020 | Manipatruni et al. |
| 10,944,404 | B1 | 3/2021 | Manipatruni et al. |
| 10,951,213 | B1 | 3/2021 | Manipatruni et al. |
| 11,043,259 | B2 | 6/2021 | Wentzlaff et al. |
| 11,277,137 | B1* | 3/2022 | Manipatruni ........ H03K 19/215 |
| 11,418,197 | B1 | 8/2022 | Dokania et al. |
| 11,501,813 | B1 | 11/2022 | Dokania et al. |
| 11,521,667 | B1 | 12/2022 | Dokania et al. |
| 11,641,205 | B1 | 5/2023 | Mathuriya et al. |
| 11,652,487 | B1 | 5/2023 | Manipatruni et al. |
| 11,664,371 | B1 | 5/2023 | Mathuriya et al. |
| 11,696,451 | B1 | 7/2023 | Dokania et al. |
| 11,967,954 | B1* | 4/2024 | Mathuriya ..... H03K 19/018521 |
| 2001/0052619 | A1 | 12/2001 | Inoue et al. |
| 2002/0163058 | A1 | 11/2002 | Chen et al. |
| 2004/0183508 | A1 | 9/2004 | Toyoda et al. |
| 2009/0058460 | A1 | 3/2009 | Kang |
| 2012/0107965 | A1 | 5/2012 | Sashida |
| 2013/0057301 | A1 | 3/2013 | Balachandran et al. |
| 2015/0337983 | A1 | 11/2015 | Dolenti et al. |
| 2017/0243917 | A1 | 8/2017 | Manipatruni et al. |
| 2017/0337983 | A1 | 11/2017 | Wang et al. |
| 2018/0025766 | A1 | 1/2018 | Dietrich et al. |
| 2018/0076815 | A1 | 3/2018 | Vigeant et al. |
| 2018/0240583 | A1 | 8/2018 | Manipatruni et al. |
| 2019/0051812 | A1 | 2/2019 | Shih et al. |
| 2019/0074295 | A1 | 3/2019 | Schröder |
| 2019/0318775 | A1 | 10/2019 | Rakshit et al. |
| 2019/0348098 | A1 | 11/2019 | El-Mansouri et al. |
| 2020/0051607 | A1 | 2/2020 | Pan et al. |
| 2020/0091407 | A1 | 3/2020 | Liu et al. |
| 2020/0091414 | A1 | 3/2020 | Liu et al. |
| 2020/0210233 | A1 | 7/2020 | Chen et al. |
| 2021/0203325 | A1 | 7/2021 | Manipatruni et al. |
| 2022/0393686 | A1* | 12/2022 | Manipatruni .......... H03K 19/21 |
| 2023/0187476 | A1 | 6/2023 | Sato et al. |
| 2025/0007484 | A1* | 1/2025 | Sekhar ................. H03H 7/0161 |

FOREIGN PATENT DOCUMENTS

| | | |
|---|---|---|
| KR | 20160089141 A | 7/2016 |
| KR | 20170099862 A | 9/2017 |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Final Office Action notified Dec. 9, 2021 for U.S. Appl. No. 17/327,614.

International Preliminary Report on Patentability received Nov. 30, 2023 for PCT Patent Application No. / US2022/070445.

International Search Report & Written Opinion notified May 19, 2022 for PCT Patent Application No. PCT/US2022/070445.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., Threshold Logic and Its Applications, Wiley-Interscience, a Division of John Wiley & Sons, Inc. New York, 1971. 8 page excerpt.

Non-Final Office Action notified Apr. 6, 2023 for U.S. Appl. No. 17/659,981.

Non-Final Office Action notified Apr. 6, 2023 for U.S. Appl. No. 17/659,992.

Non-Final Office Action notified Apr. 14, 2023 for U.S. Appl. No. 17/327,662.

Non-Final Office Action notified Dec. 12, 2022 for U.S. Appl. No. 17/808,290.

Non-Final Office Action notified Jan. 24, 2022 for U.S. Appl. No. 17/327,648.

Non-Final Office Action notified Jan. 24, 2022 for U.S. Appl. No. 17/327,649.

Non-Final Office Action notified Jan. 24, 2022 for U.S. Appl. No. 17/327,659.

Non-Final Office Action notified Jul. 17, 2023 for U.S. Appl. No. 17/659,994.

Non-Final Office Action notified Mar. 16, 2023 for U.S. Appl. No. 17/327,660.

Non-Final Office Action notified Nov. 16, 2021 for U.S. Appl. No. 17/327,614.

Notice of Allowance notified Apr. 13, 2023 for U.S. Appl. No. 17/327,660.

Notice of Allowance notified Apr. 28, 2022 for U.S. Appl. No. 17/327,649.

Notice of Allowance notified Dec. 7, 2021 for U.S. Appl. No. 17/327,652.

Notice of Allowance notified Feb. 2, 2023 for U.S. Appl. No. 17/552,079.

Notice of Allowance notified Feb. 17, 2023 for U.S. Appl. No. 17/808,290.

Notice of Allowance notified Jan. 12, 2021 for U.S. Appl. No. 17/327,614.

Notice of Allowance notified Jan. 28, 2022 for U.S. Appl. No. 17/327,651.

Notice of Allowance notified Jan. 30, 2023 for U.S. Appl. No. 17/550,910.

Notice of Allowance notified Jan. 31, 2023 for U.S. Appl. No. 17/552,101.

Notice of Allowance notified Mar. 7, 2022 for U.S. Appl. No. 17/327,659.

Notice of Allowance notified Mar. 7, 2023 for U.S. Appl. No. 17/550,908.

Notice of Allowance notified Mar. 11, 2022 for U.S. Appl. No. 17/327,648.

Notice of Allowance notified Mar. 13, 2023 for U.S. Appl. No. 17/552,107.

Notice of Allowance notified Mar. 17, 2023 for U.S. Appl. No. 17/552,247.

Notice of Allowance notified May 1, 2023 for U.S. Appl. No. 17/659,981.

Notice of Allowance notified May 1, 2023 for U.S. Appl. No. 17/659,992.

Notice of Allowance notified May 15, 2023 for U.S. Appl. No. 17/327,662.

Notice of Allowance notified Oct. 31, 2023 for U.S. Appl. No. 17/659,994.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

* cited by examiner

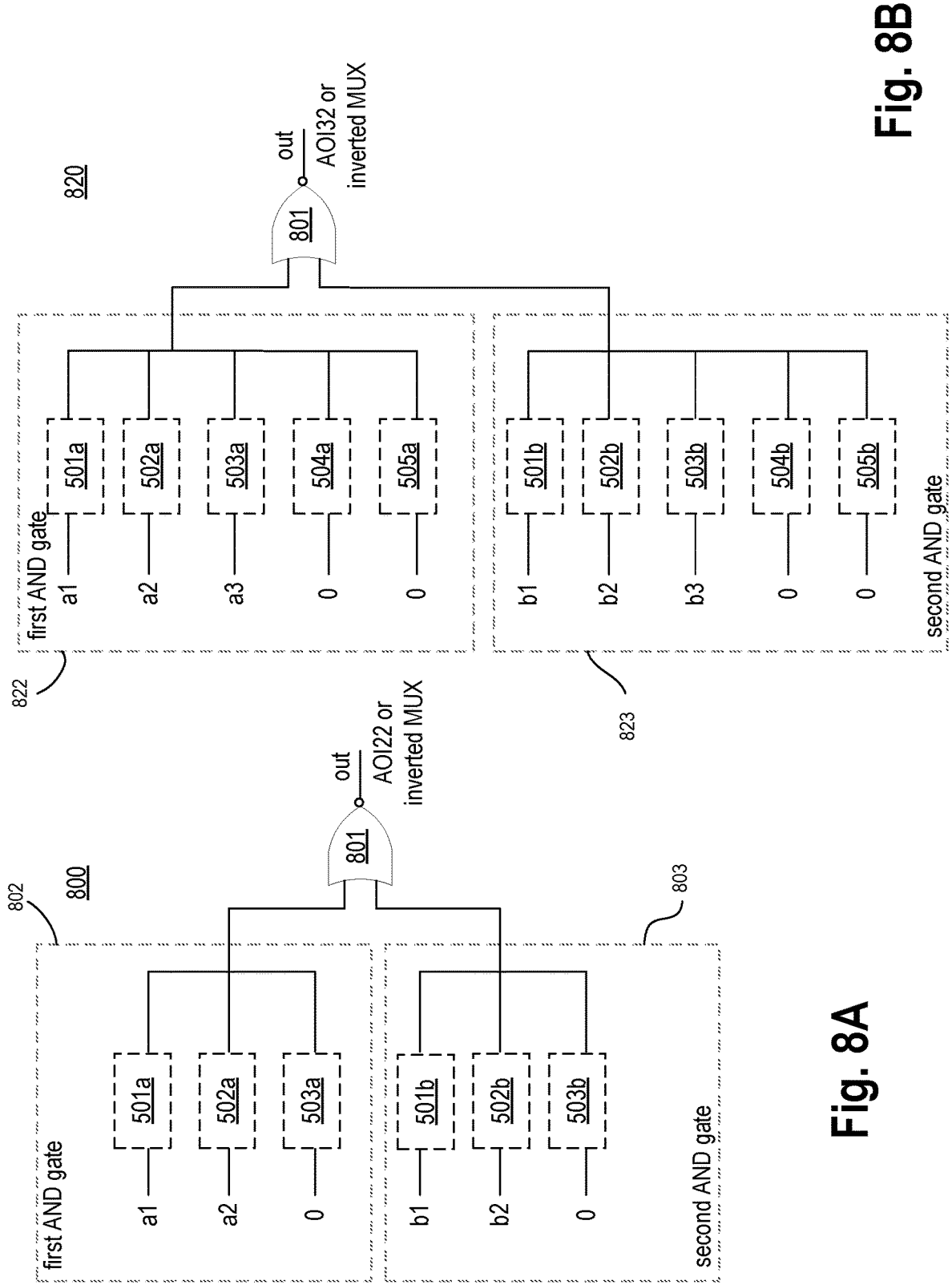

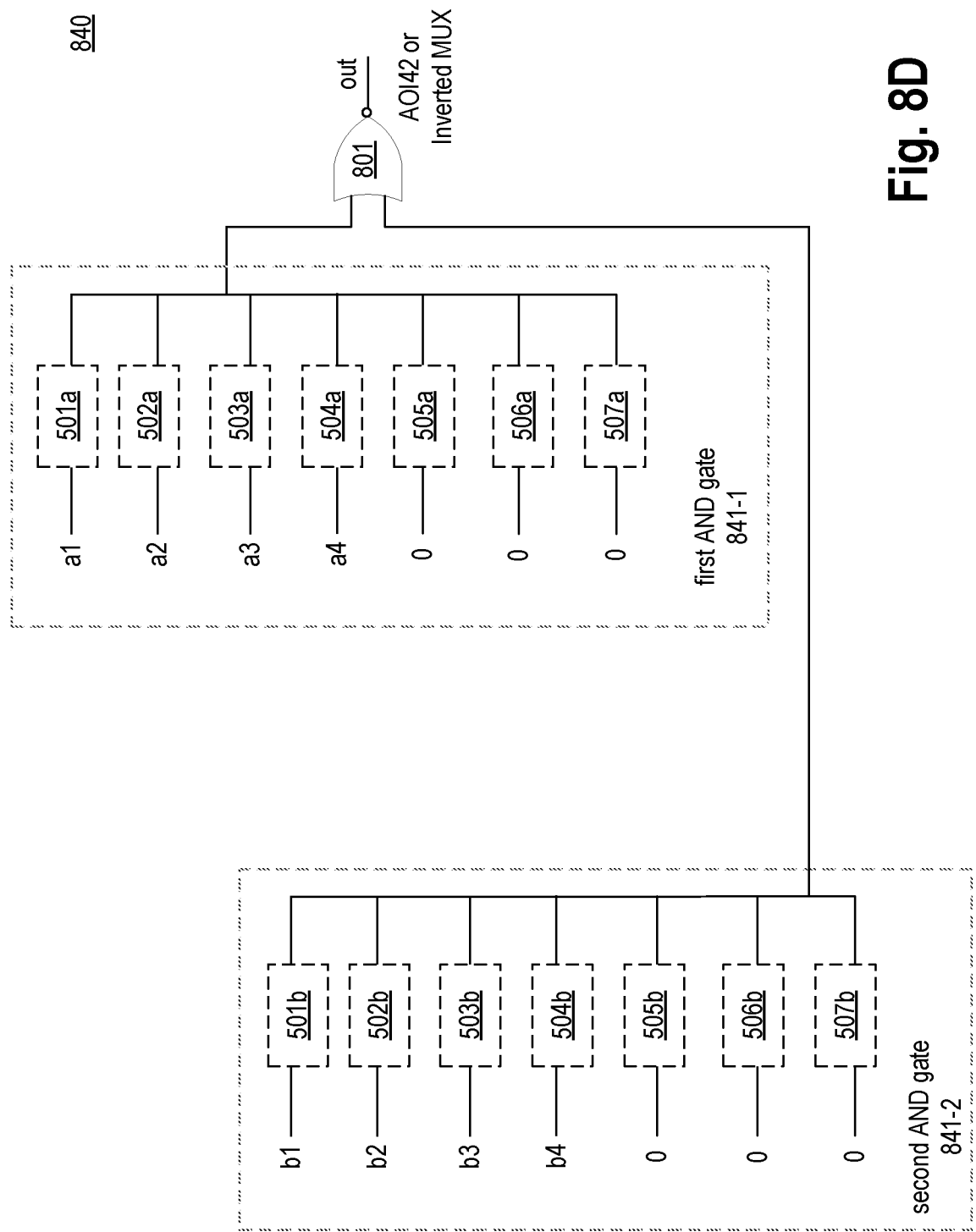

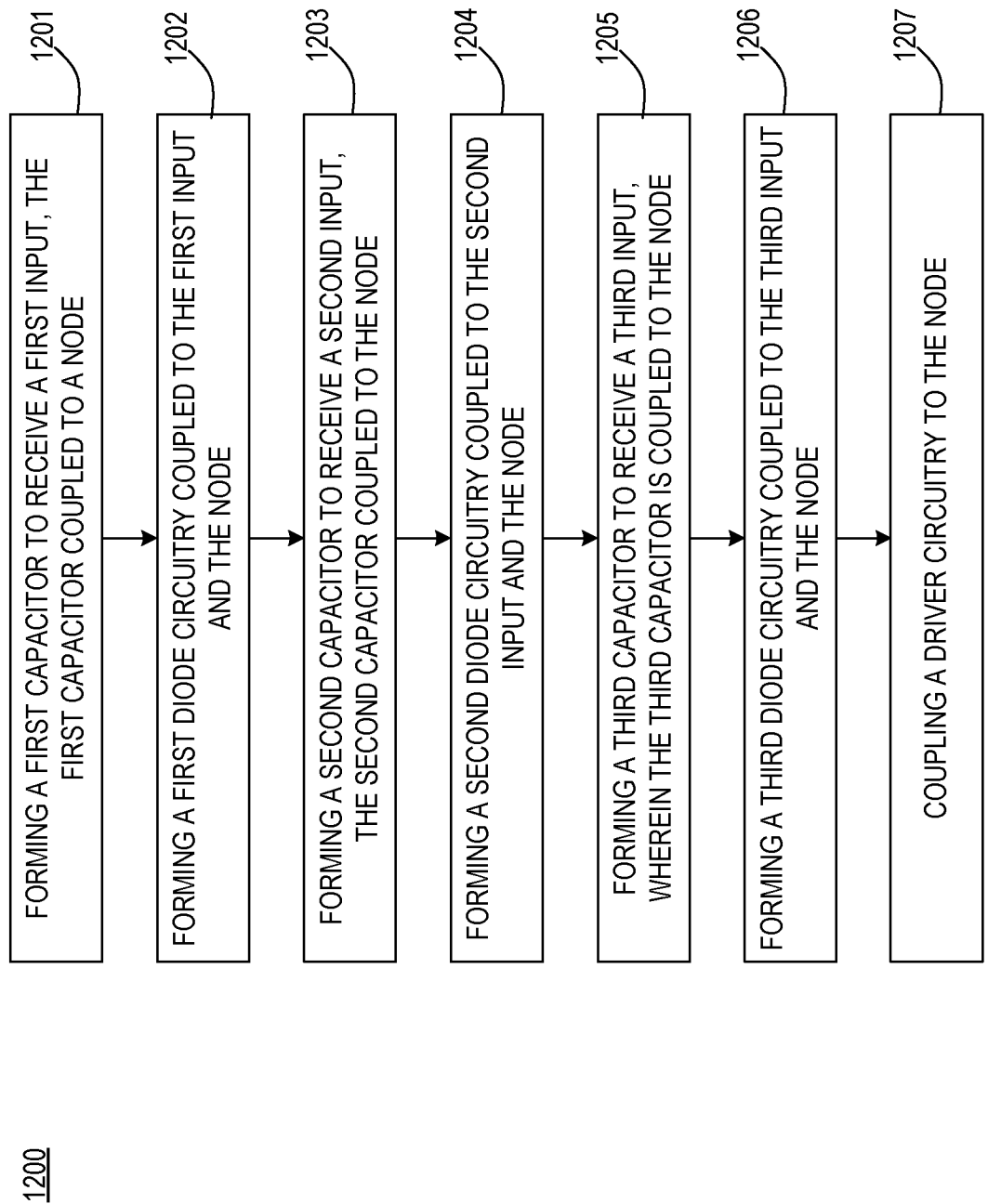

DIODE CONNECTED NON-LINEAR INPUT CAPACITORS BASED MAJORITY GATE

BACKGROUND

Majority or minority logic gates that are based on capacitors have a common floating summation node that is coupled to a subsequent driver that may have n-type and/or p-type transistor(s). Gate leakage through the subsequent driver may cause voltage on the summation node to drift over time. For example, the voltage on the summation node may discharge to ground (Vss) when gate leakage through an n-type device (e.g., NMOS) dominates. Likewise, the voltage on the summation node may charge to supply voltage level (Vdd) when gate leakage through a p-type device (e.g., PMOS) dominates. In some cases, the voltage on the summation node may drift higher (e.g., charge up) when it is supposed to stay low, or drift lower (e.g., discharge down) when it is supposed to stay high. Such behavior may cause the majority or minority logic gate to lose its functionality.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8A is a schematic illustrating a 4-input AND-OR-INVERT complex logic gate comprising two 2-input AND gates as majority gates and a CMOS NOR gate having non-linear polar capacitors integrated with back-to-back diodes, in accordance with at least one example.

FIG. 8B is a schematic illustrating a 6-input AND-OR-INVERT complex logic gate comprising two 3-input AND gates as majority gates and a CMOS NOR gate having non-linear polar capacitors integrated with back-to-back diodes, in accordance with at least one example.

FIG. 8D is a schematic illustrating an 8-input AND-OR-INVERT complex logic gate comprising two 4-input AND gates as majority gates and a CMOS NOR gate having non-linear polar capacitors integrated with back-to-back diodes, in accordance with at least one example.

FIG. 12 illustrates a flowchart of a method of forming a 3-input majority gate with non-linear input capacitors and back-to-back diodes, in accordance with at least one example.

DETAILED DESCRIPTION

Figure 1A:
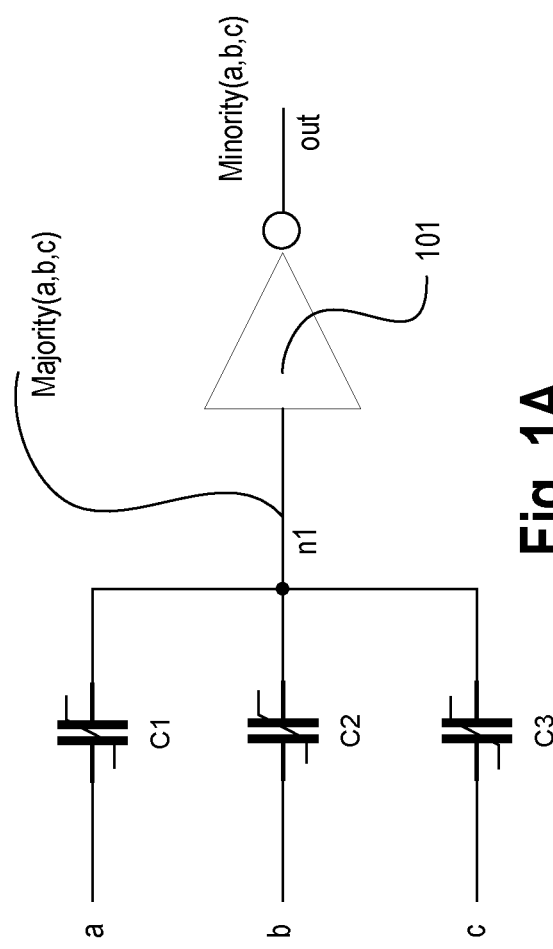
FIG. 1A is a schematic illustrating a 3-input majority gate with non-linear input capacitors resulting in data loss due to leakage.

FIG. 1A is a schematic illustrating a 3-input majority gate 100 with input capacitors C1, C2, and C3 resulting in data loss on a summing node n1 due to leakage. The summing node n1 is coupled to an input of a driver circuitry 101 that produces an output out. Voltage on the summing node n1 is a non-rail-to-rail voltage swing (e.g., not spanning the whole voltage range between the power supply and the ground) at the input of driver circuitry 101. This non-rail-to-rail voltage swing may be caused by leakage through driver circuitry 101. 3-input majority gate 100 is a typical majority gate that uses linear input capacitors C1, C2, and C3 that are coupled to inputs a, b, and c, respectively, on one end and to a summing node n1 on another end. The summing node n1 is where the majority function is performed e.g., Majority(a, b,c). The voltage developed on node n1 is then used to drive driver circuitry 101 (e.g., a CMOS driver). If driver circuitry 101 is an inverter, the output "out" provides a minority function of the inputs e.g., Minority(a,b,c). Here, the voltage developed on node n1 is not a rail-to-rail voltage. As a result, standby current rushes through driver circuitry 101 because some of its transistors are not fully off due to the non-rail-to-rail voltage on node n1. As such, energy is wasted and 3-input majority gate 100 becomes an unsuitable gate for use in any low power applications. The charge on the summing node n1 may charge to power supply node (Vdd) or ground node (Vss) over time due to leakage of capacitors C1, C2, and C3 and/or leakage through devices of driver circuitry 101. The same is observed when capacitors C1, C2, and C3 are non-linear capacitors having non-linear polar material such as paraelectric material and ferroelectric material.

Figure 1B:
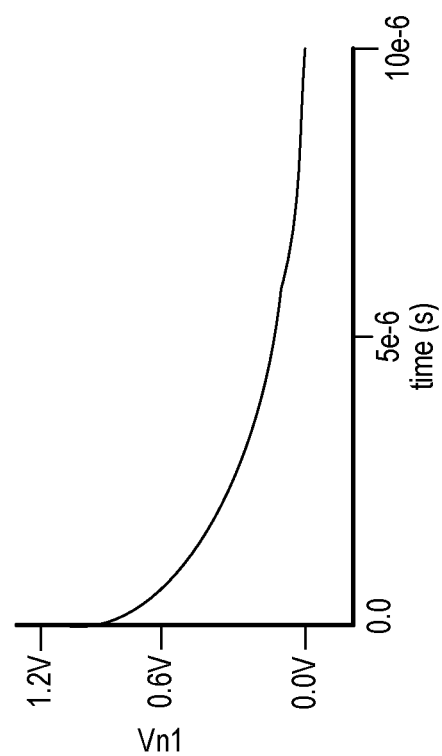
FIG. 1B illustrates a plot showing leakage on a summation node over time.

FIG. 1B illustrates a plot 120 showing leakage on the summation node n1 over time. Over time, charge developed on node n1 discharges to zero or ground through a device of driver circuitry 101 coupled to ground. In another example, charge on node n1 may charge to Vdd through a device of driver circuitry 101 coupled to Vdd.

Figure 2B:
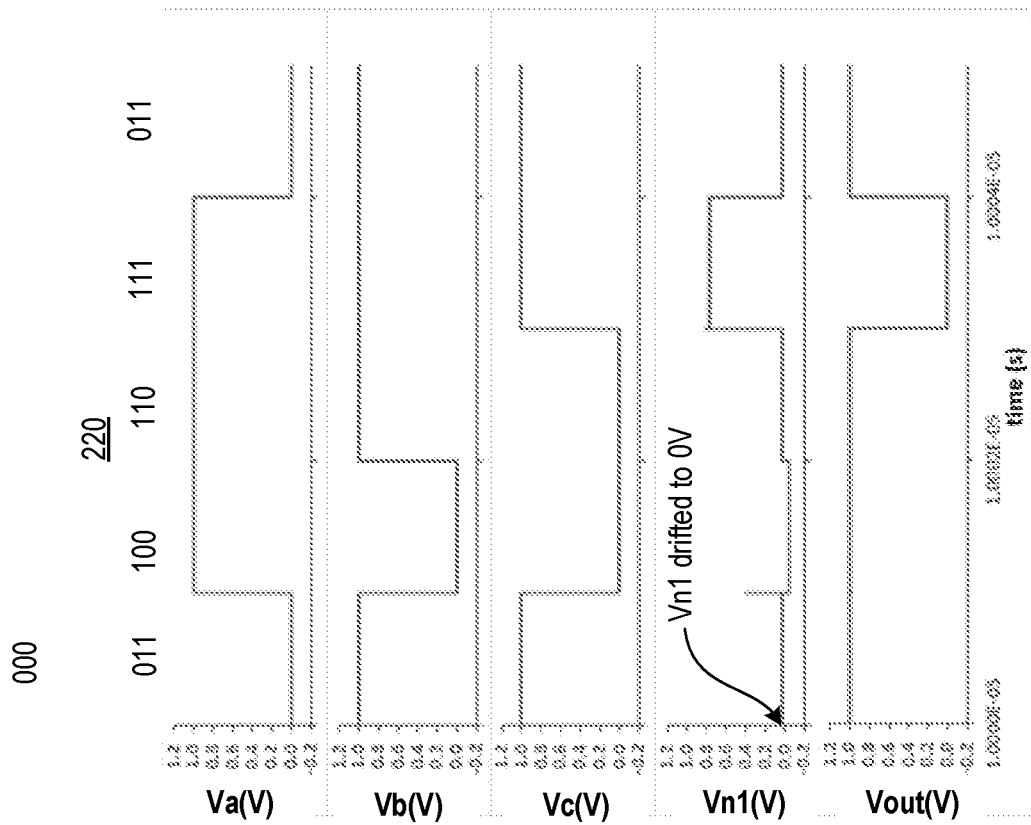
FIGS. 2A-B illustrate plots showing minority and majority function of the 3-input majority gate before leakage and after leakage impact on the summation node, respectively.
Figure 2A:
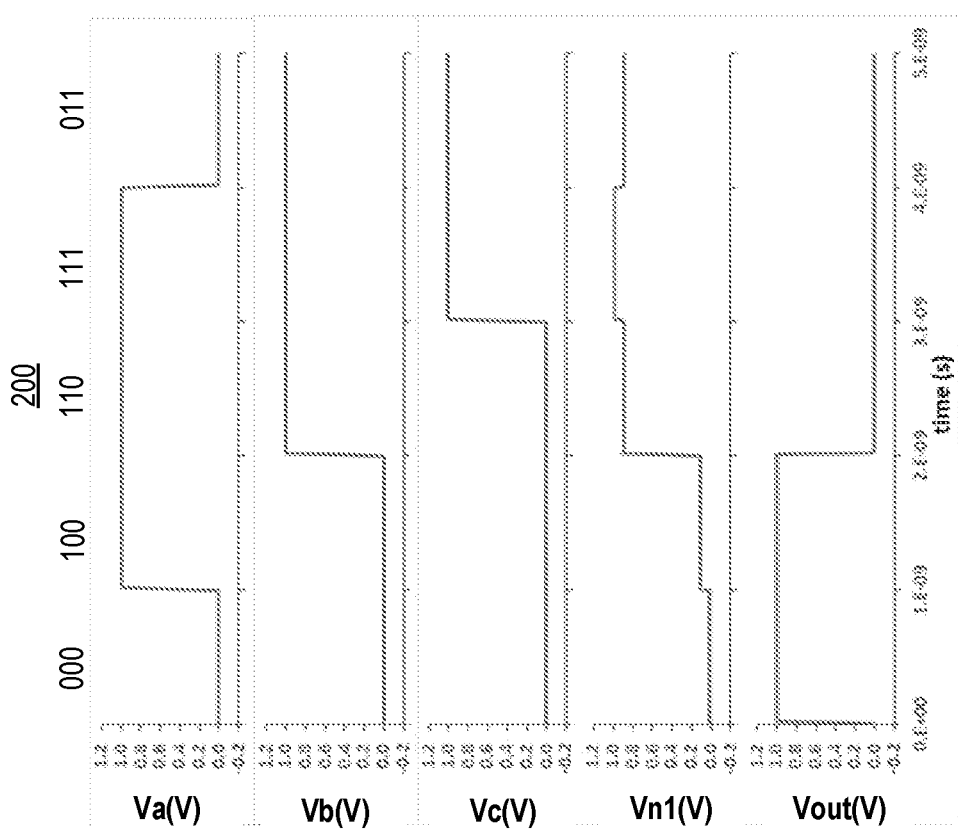

FIGS. 2A-B illustrate plots 200 and 220 showing minority and majority function of 3-input majority gate 100 before leakage and after leakage impact on the summation node, respectively. Plot 200 is a timing diagram that illustrates digital input signals for inputs a, b, and c. Depending on the logic levels of inputs a, b, and c, a voltage Vn1 is developed on the summing node n1. The different voltage levels are illustrated by logic code 000, 100, 110, 111, and 011 for inputs a, b, and c respectively (e.g., 000 refers to a=0, b=0, and c=0). Voltage Vn1 is illustrated by waveform Maj(a,b,c). The voltage Vout driven by driver circuitry 101 (here, an inverter) on node "out" is the minority output, Min(a,b,c).

Plot 220 illustrates a timing diagram of 3-input majority gate 100 after a long time has passed (e.g., 10 microseconds) with the same inputs at 011 (which were the last input settings of plot 200). In this example, the voltage Vn1 on the summing node n1 drifts to 0V which causes the output voltage Vout to be a logic high. Here, 3-input majority gate 100 now behaves as a NAND gate instead of a majority gate. It may take a long time (e.g., 10 microseconds or more) for 3-input majority gate 100 to recover and function as a majority gate. As a result, 3-input majority gate 100 becomes an unsuitable gate for use in any low power applications because it may stop operating properly if the input states remain unchanged for a period of time, allowing the voltage Vn1 on summing node n1 to charge or discharge to Vdd or Vss.

Figure 3:
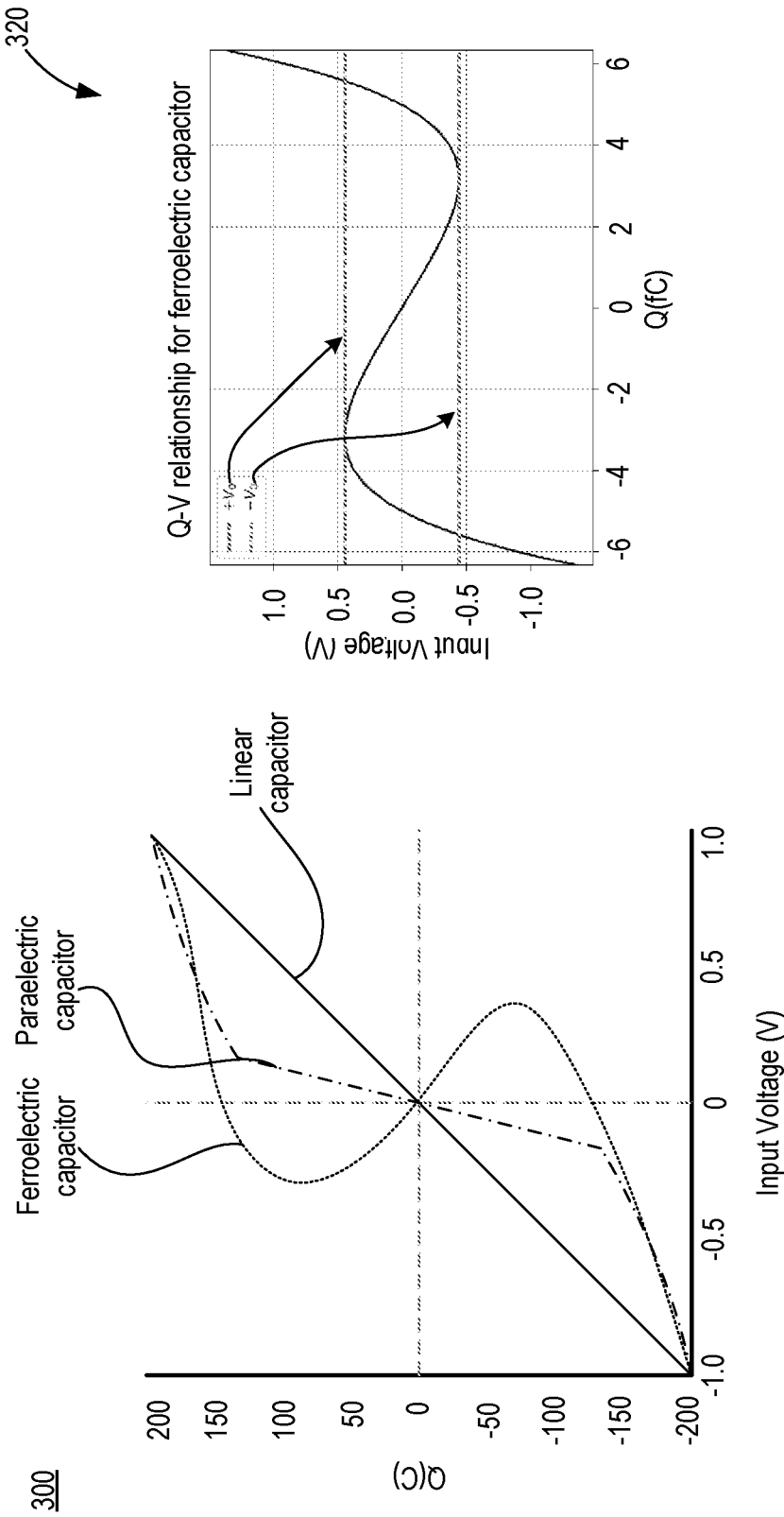
FIG. 3 illustrates a set of plots showing charge transfer function for non-linear capacitors compared to a linear capacitor, and charge-voltage relationship for a ferroelectric capacitor.

FIG. 3 illustrates a set of plots showing charge transfer function for non-linear capacitors compared to a linear capacitor, and charge-voltage relationship for a ferroelectric capacitor. Plot 300 compares the transfer function for a linear capacitor, a paraelectric capacitor (a non-linear capacitor) and a ferroelectric capacitor (a non-linear capacitor). Here, the x-axis is input voltage or voltage across the capacitor, while the y-axis is the charge on the capacitor. Plot 320 shows the charge and voltage relationship for a ferroelectric capacitor. A capacitor with ferroelectric (FE) material is a non-linear capacitor with its potential $V_F(Q_F)$ as a cubic function of its charge. Plot 320 illustrates characteristics of an FE material. Plot 320 is a charge-voltage (Q-V) plot for a block of $Pb(Zr_{0.5}Ti_{0.5})O_3$ of area $(100 \text{ nm})^2$ and thickness 20 nm (nanometer). Plot 320 shows local extrema at $+/-V_o$ indicated by the dashed lines. Here, the term $V_c$ is the coercive voltage. In applying a potential V across the FE material, its charge can be unambiguously determined only for $|V|>V_o$. Otherwise, the charge of the FE material is subject to hysteresis effects.

For a paraelectric capacitor which is one kind of non-linear polar capacitor, the charge transfer function is expressed as:

$$Q = P \, \tanh\left(\frac{V_{in}}{V_X}\right) + C_d V_{in} \quad (1)$$

where, Vin is the input voltage, P is the polarization charge density, Vx is the scaling voltage, and Vd is the dielectric capacitance component. The leakage from the paraelectric capacitor has the same functional form as the first term of equation 1.

Some examples describe a new class of logic gates that use non-linear polar material. The logic gates include multi-input majority or minority gates. Input signals in the form of digital signals are driven to first terminals of capacitors with non-linear polar material. The second terminals of the capacitors with non-linear polar material are coupled to form a majority node (or a summing node). The majority function of the input signals occurs on the summing node. The majority node (herein also referred to as the summing node) is then coupled to a capacitive node or a device such as a gate terminal of a transistor. In at least one example, this capacitive node is connected to a logic gate such as a CMOS circuitry, a buffer, an inverter, a NAND gate, a NOR gate, a multiplexer, and an XOR gate, etc. The output of the logic can be used to drive additional multi-input majority or minority gates or to devices of other types of transistor technologies. The logic gate can be implemented in any suitable technology such as complementary metal oxide semiconductor (CMOS), tunneling field effect transistor (TFET), GaAs based transistors, bipolar junction transistors (BJTs), or Bi-CMOS transistors, etc. As such, majority or minority gates of various examples can be combined with existing transistor technologies.

In at least one example, at least one input to an individual multi-input majority gate is a fixed input. Other inputs are driven to non-linear input capacitors on their respective first terminals. The fixed input can be tied to or coupled to a supply rail such as a power supply rail or a ground supply rail.

Input voltages are applied to input capacitors, and polarization in these capacitors switch according to the applied input voltages. The applied input voltages lead to alternating current (AC) flow of charges from the input capacitors to the summation node (with net zero charge), where the charge at the summation node implements the majority function. The summation node may be coupled to an output capacitor or a driver circuit with input capacitance. The summation node is a floating node, and so voltage fluctuations and random or systematic leakage to or from the summation node may lead to an accumulation of charge in DC. This accumulation of charge may upset the majority function. In at least one example, a small and deliberate leakage is introduced through the input capacitors that maintain the switched charges on the summation node and thus reinforces the majority function in DC. In at least one example, this small and deliberate leakage is provided by a diode structure. In at least one example, the diode structure provides a saturated IV (current-voltage) behavior which maintains the majority function in DC at the summation node.

In at least one example, a diode structure (or circuitry) is coupled to an individual input capacitor. In at least one example, the diode structure comprises a back-to-back diode arrangement with cathodes coupled to the terminals of the individual input capacitor and anodes coupled to one another. In at least one example, the back-to-back diode arrangement includes an n-p-n junction or a Schottky barrier. In at least one example, the diode structure may be implemented as a transistor (field effect transistor (FET)) biased in saturation state to provide a saturation IV behavior.

In at least one example, the charge-voltage function for the non-linear polar capacitor is replicated in a DC path which is provided by the back-to-back diode arrangement in parallel to the non-linear polar capacitor. In at least one example, the non-linear polar capacitor provides an AC path while the DC path from the back-to-back diode arrangement provides a stable steady state. Collectively, with the AC path and the DC path, the voltage Vn1 on the summing node n1 is maintained despite leakage through a driver circuitry connected to the summing node. In at least one example, the non-linear leakage response from the back-to-back diode arrangement provides a DC resistive-majority that complements the AC capacitive-majority from the non-linear polar capacitor, thus avoiding the loss of state on the summation node. As such, reset device(s) on the summing node are not used, in accordance with at least one example.

The majority gate of various examples lowers the power consumption because they do not use switching transistors and the interconnect routings are much fewer than the interconnect routings used in transitional CMOS logic gates. For example, 10× fewer interconnect length is used by the majority gate of various examples than traditional CMOS circuits for the same function and performance. The capacitors with non-linear polar material and their associated back-to-back diode arrangement provide non-volatility that allows for intermittent operation and zero power drain when not in use.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power. The back-to-back diode arrangement, associated with the capacitor having non-linear polar material, assists in maintaining state on a summing node as discussed herein.

Capacitors with non-linear polar material can be used with any type of transistor. For example, capacitors with non-linear polar material of various examples can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may comprise one or more signals that may travel in either direction and may be implemented with any suitable type of signal scheme.

It is pointed out that those elements of the figures having the same reference numbers (or names) as the elements of any other figure can operate or function in any manner similar to that described, but are not limited to such.

Figure 4:
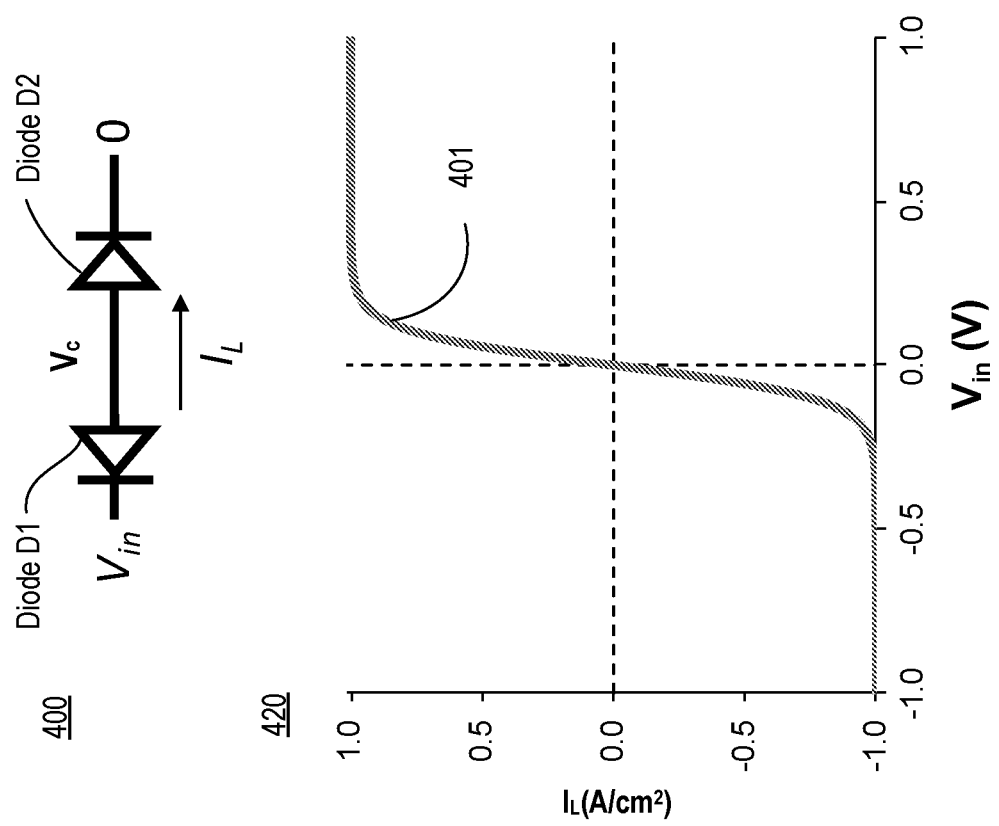
FIG. 4 is a schematic of back-to-back diodes and a plot showing current and voltage function of the back-to-back diodes, in accordance with at least one example.

FIG. 4 is a schematic illustrating back-to-back diodes 400 and a plot 420 showing current and voltage function of the back-to-back diodes, in accordance with at least one example. In at least one example, back-to-back diodes D1 and D2 have respective anodes coupled to one another or electrically shorted. In at least one example, cathodes of diode D1 and diode D2 are connected to the first and second terminals of an individual capacitor. The back-to-back diodes D1 and D2 are collectively an n-p-n junction, in accordance with at least one example. The plot shows waveform 401 illustrating leakage current $I_L$ in A/cm2 as a function of input voltage Vin applied to the cathode of diode D1 while the cathode of diode D2 is connected to ground (0V). Using an ideal diode equation with saturation current $I_S$ (e.g., 1 A/cm2), ideality factor n (e.g., n=2), and thermal voltage $v_T = kT/q$ (e.g., 28 mV), leakage current $I_L$ can be expressed as:

$$I_L = -I_S\left(e^{\frac{V_c - V_{in}}{nv_T}} - 1\right) = I_S\left(e^{\frac{V_c}{nv_T}} - 1\right) \quad (2)$$

Solving equation (2) for $V_c$ results in:

$$I_L = I_S\left(1 - \frac{2}{1 + e^{\frac{V_{in}}{nv_T}}}\right) \quad (3)$$

In at least one example, the charge-voltage function (see equation 1) for the non-linear polar capacitor is replicated in a DC path which is provided by the back-to-back diode arrangement (e.g., diodes D1 and D2) in parallel to the non-linear polar capacitor. In at least one example, the non-linear polar capacitor provides an AC path while the DC path from the back-to-back diode arrangement provides a stable steady state. Collectively, with the AC path and the DC path, the voltage Vn1 on the summing node n1 is maintained despite leakage. The non-linear leakage response (see equation 3) from the back-to-back diode arrangement provides a DC resistive-majority that complements the AC capacitive-majority from the non-linear polar capacitor, thus avoiding the loss of state on the summing node. During switching activity of the capacitor (e.g., when an input to the capacitor is switching), the AC path provides the margin to keep the state on the summing node at its expected level. When there is no activity at the input of the capacitor, the DC path which has a leakage function that is non-linear (as shown in equation 3), maintains the state of the summing node. As such, reset device(s) on the summing node are not used, which reduces power and area, in accordance with at least one example.

Figure 5:
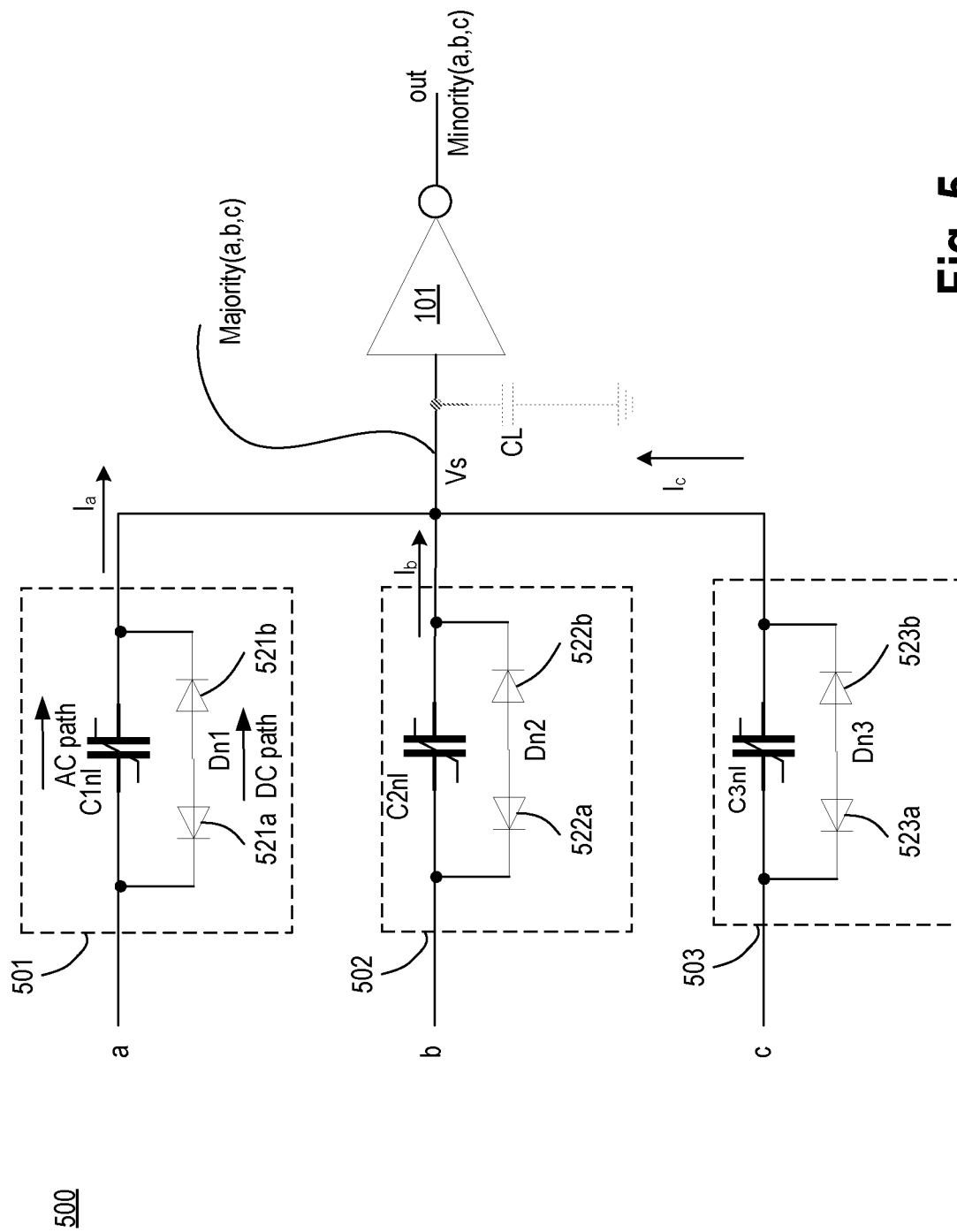
FIG. 5 is a schematic illustrating a 3-input majority gate with non-linear input capacitors and back-to-back diodes, in accordance with at least one example.

FIG. 5 is a schematic illustrating a 3-input majority gate 500 with non-linear input capacitors and back-to-back diodes, in accordance with at least one example. In at least one example, 3-input majority gate 500 comprises a set of devices coupled to inputs and summing node Vs. The set of devices includes a first device 501, a second device 502, and a third device 503. For larger input majority gates, more such devices are used and coupled to additional inputs and the summing node.

In at least one example, first device 501 includes a non-linear input capacitor C1n1 coupled in parallel to a first back-to-back diode arrangement. In at least one example, the first back-to-back diode arrangement comprises diode 521a having a cathode coupled to input a (e.g., that receives digital signal a), which is also coupled to a first terminal of non-linear input capacitor C1n1. In at least one example, the first back-to-back diode arrangement comprises diode 521b having a cathode coupled to the summing node Vs which is also coupled to a second terminal of the non-linear input capacitor C1n1. In at least one example, the anode of diode 521a is coupled to the anode of diode 521b (as shown by common node Dn1).

In at least one example, second device 502 includes a non-linear input capacitor C2n1 coupled in parallel to a second back-to-back diode arrangement. In at least one example, the second back-to-back diode arrangement comprises diode 522a having a cathode coupled to input b (e.g., that receives digital signal b), which is also coupled to a first terminal of non-linear input capacitor C2n1. In at least one example, the second back-to-back diode arrangement comprises diode 522b having a cathode coupled to the summing node Vs which is also coupled to a second terminal of the non-linear input capacitor C2n1. In at least one example, the anode of diode 522a is coupled to the anode of diode 522b (as shown by common node Dn2).

In at least one example, third device 503 includes a non-linear input capacitor C3n1 coupled in parallel to a third back-to-back diode arrangement. In at least one example, the third back-to-back diode arrangement comprises diode 523a having a cathode coupled to input c (e.g., that receives digital signal c), which is also coupled to a first terminal of non-linear input capacitor C3n1. In at least one example, the third back-to-back diode arrangement comprises diode 523b having a cathode coupled to the summing node Vs which is also coupled to a second terminal of the non-linear input capacitor C3n1. In at least one example, the anode of diode 523a is coupled to the anode of diode 523b (as shown by common node Dn3). Here, signal names and node names are interchangeably used. For example, 'a' refers to node 'a' or signal 'a' depending on the context of the sentence.

In at least one example, the diodes in the back-to-back diode arrangement are replaced by an n-p-n junction, where a first 'n' component of the n-p-n junction is coupled to a first terminal of the capacitor, and where a second 'n' component of the n-p-n junction is coupled to a second terminal of the capacitor.

In at least one example, the n-p-n junction is replaced with a junction of a semiconductor material and a metal material that functions as a Schottky diode. Schottky diodes are formed by metal-semiconductor junctions. The metals can be different or the same as the electrodes used for a non-linear polar capacitor. The semiconductor could be from any semiconductor material. The work function difference between the electrodes and the semiconductor and the doping in the semiconductor can be used to tune the Schottky diodes I-V characteristics (e.g., $I_S$ and n of eq. (3). Also, the semiconductor diodes could be n-p-n or p-n-p, in accordance with at least one example. In at least one example, the metal materials are Pt, Ir, Ru, Au, Ag, Cu, TaN, TiN. In at least one example, the semiconductor materials are LaSrMnO3, SrRuO3, NbSrTiO3, BaSnO3, LaBaSnO3, LaSrCoO3.

In at least one example, 3-input majority gate 500 comprises a driver circuitry 101. In this example, driver circuitry 101 is an inverter. In other examples, other types of driver circuitries can be used such as NAND gate, NOR gate, multiplexer, buffer, and other logic gates. The majority function is performed at summing node Vs as Majority(a, b,c). In this example, since driver circuitry 101 is an inverter, minority function is performed at the output "out" as Minority(a,b,c).

In at least one example, the non-linear polar capacitors C1n1, C2n1, and C3n1 provide AC paths from respective inputs a, b, and c to the summing node Vs. In at least one example, the back-to-back diode arrangements in the set of devices 501, 502, and 503 provide DC paths from respective inputs a, b, and c to the summing node Vs. Collectively, with the AC path and the DC path, the voltage on the summing node Vs is maintained despite leakage from driver circuitry 101. The non-linear leakage response (see equation 3) from the back-to-back diode arrangements in the set of devices 501, 502, and 503 provides DC resistive-majority that complements the AC capacitive-majority from the non-linear polar capacitors C1n1, C2n1, and C3n1, thus avoiding the loss of state on the summation node Vs. As such, reset device(s) on the summing node Vs may not be used, in accordance with at least one example.

Here, driver circuitry 101 is an inverter coupled between supply voltage Vss and ground node Vss. Typically, inverters switch when the input moves across the Vdd/2 voltage level. If the input is less than Vdd/2 the output goes high, and if the input is higher than Vdd/2 the output goes low. The majority gate has to produce a summing node voltage higher or lower than Vdd/2 with enough margin. The higher the margin the better. If margins are low (e.g., few mV above or below Vdd/2), high leakage from supply to ground develops across the inverter. Also, low margins may produce loss of functionality due to threshold voltage variations. In at least one example, the set of devices 501, 502, and 503 of majority gate 500 are specified to have leakage current (under room temperature) to be high enough to maintain the majority function on the summation node Vs. In at least one example, the worst-case leakage of capacitors C1$n$1, C2$n$1, and C3$n$1 is desired to be limited to a reasonable factor over the leakage of the CMOS circuit which is connected to the summation node.

The non-linear charge response from the non-linear input capacitors C1$n$1 C2$n$1, and C3$n$1 results in output voltages close to or at rail-to-rail voltage levels, which reduces the high leakage problem faced from majority gates that use linear input capacitors. In at least one example, the summing node Vs or the majority node has a signal which reaches closer to rail-to-rail (e.g., from ground to Vdd) resulting in lower leakage in the subsequent logic gate. One drawback of using linear input capacitors, as opposed to non-linear input capacitors, is that the voltage on the summing node or majority output node does not reach rail-to-rail voltage, resulting in high leakage in the output driver or logic gate. Such issues are resolved by majority gate 500. In multi-input majority or minority gates such as majority gate 500, the non-linear charge response of the set of devices 501, 502, and 503 result in output voltages close to rail-to-rail. Approaching rail-to-rail as close as possible is a desired goal.

Here, in some examples, close to rail-to-rail voltage may mean a voltage which is within 20% of the rail-to-rail level. In some applications and conditions, the output voltage (on summing node) may be more off than rail-to-rail voltage levels (e.g., the voltage may be more than 20% but less than 30% of rail-to-rail voltage levels) and still give a majority function better than corresponding majority function achieved from a CMOS based majority gate. Bringing the majority output close to rail-to-rail voltage eliminates the high leakage problem faced from majority gates formed using linear input capacitors. As such, the input capacitors with non-linear polar material can drive another capacitive input circuit directly.

In at least one example, in addition to the gate capacitance of driver circuitry 101, an additional linear capacitor CL is coupled to summing node Vs and ground as shown. In at least one example, this linear capacitor CL is a non-ferroelectric capacitor. In at least one example, the non-ferroelectric capacitor includes one of: a dielectric capacitor, a paraelectric capacitor, or a non-linear dielectric capacitor. A dielectric capacitor comprises first and second metal plates with a dielectric between them. Examples of such dielectrics are: HfO, ABO3 perovskites, nitrides, oxy-fluorides, oxides, etc. A paraelectric capacitor comprises first and second metal plates with a paraelectric material between them. In at least one example, f-orbital materials (e.g., lanthanides) are doped to ferroelectric materials to make paraelectric material. Examples of room temperature paraelectric material include: $SrTiO_3$, $Ba_{(x)}Sr_{(y)}TiO_3$ (e.g., where x is –0.5, and y is 0.95), $HfZrO_2$, Hf—Si—O, La-substituted $PbTiO_3$, or PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors, or transistor capacitor. The capacitor CL can be implemented as MIM (metal-insulator-metal) capacitor technology, transistor gate capacitor, hybrid of metal capacitors, or transistor capacitor.

In at least one example, the non-linear input capacitors C1$n$1, C2$n$1, and C3$n$1 comprise non-linear polar material. In at least one example, the non-linear polar material includes one of: a ferroelectric (FE) material, a paraelectric material, a relaxor ferroelectric, or a non-linear dielectric. In at least one example, the paraelectric material is the same as FE material but with chemical doping of the active ferroelectric ion by an ion with no polar distortion. In some cases, the non-polar ions are non-s orbital ions formed with p, d, f external orbitals. In at least one example, non-linear dielectric materials are the same as paraelectric materials, relaxors, and dipolar glasses.

In at least one example, the non-linear polar material is to be doped, e.g., by one or more elements from lanthanide series of periodic table, or one or more elements of 3d, 4d, 5d, 6d, 4f, or 5f series of periodic table. In at least one example, non-linear polar material includes perovskite. In at least one example, perovskites can be suitably doped to achieve a spontaneous distortion in a range of 0.3% to 2%. In at least one example, in chemically substituted lead titanate such as Zr in Ti site or La, Nb in Ti site, concentration of these substitutes is such that it achieves spontaneous distortion in range of 0.3% to 2%.

In at least one example, the non-linear polar material has a form ABB'$O_3$, and wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B" includes one of: Sc, Ti, V, Cr, Mn, Fe, Co, Ni, Cu, or Zn.

In at least one example, the non-linear polar material has a form AA'B$O_3$, and wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "A" includes one of Y, La, Sc, Ce, Pr, Nd, Pm, Sm, Eu, Gd, Tb, Dy, Ho, Er, T, Yb, Lu, wherein A' comprises a valency of site A, but different ferroelectric polarizability from A.

In at least one example, the non-linear polar material has a form AB$O_3$, and wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb.

In at least one example, the non-linear polar material includes a lead-based perovskite material which includes lead zirconium titanate (PZT) or PZT with a first doping material, wherein the first doping material is one of La or Nb. In at least one example, the non-linear polar material includes non-Pb perovskites that can also be doped, e.g., by La or lanthanides. Non-Pb perovskite material can include one or more of: La, Sr, Co, Cr, K, Nb, Na, Sr, Ru, Y, Fe, Ba, Hf, Zr, Cu, Ta, Bi, Ca, Ti, or Ni. In at least one example, non-Pb perovskite material includes one of: $BaTiO_3$, $KNbO_3$, or $NaTaO_3$.

In at least one example, the non-linear polar material includes a low voltage ferroelectric material. Low voltage FE materials can be of form ABB'$O_3$, where "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, "B" includes one of Mn, Fe, Ta, or Nb, and B' includes one of: Sc, Ti, V, Cr, Mn, Fe, Co, Ni, Cu, or Zn.

In at least one example, where the non-linear polar material has the form AA'B$O_3$, "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, "B" includes one of Mn, Fe, Ta, or Nb, A' includes one of Y, La, Sc, Ce, Pr, Nd, Pm, Sm, Eu, Gd, Tb, Dy, Ho, Er, T, Yb, Lu, and A' comprises a valency of site A, but with different ferroelectric polarizability from A. Voltage below 3 volts is sufficiently low to be characterized as low voltage.

In at least one example, the non-linear polar material includes bismuth ferrite (BFO) with a second doping material, wherein the second doping material is one of: lanthanum, elements from lanthanide series of a periodic table, or elements of 3d, 4d, 5d, 6d, 4f, or 5f series of periodic table. In at least one example, BFO is doped with Mn or Sc, wherein Mn or Sc achieve a spontaneous distortion in BFO in a range of 0.3% to 2%.

In at least one example, the non-linear polar material includes a relaxor ferroelectric material. In at least one example, the relaxor ferroelectric material is a $BaTiO_3$ (BTO) based relaxor which includes one of: $BaTiO_3$—$Bi(Zn_{1/2}Ti_{1/2})O_3$ (BTO-BZT), $BaTiO_3$—$BiScO_3$ (BTO-BS): $BiScO_3$, $Ba_{(1-x)}Sr_xTiO_3$ (BST), $BaTiO_3$—$Pb(Mg_{1/3}Nb_{2/3})O_3$ (BTO-PMN), $BaTi_{(1-x)}Zr_xO_3$ (BTZ), $BaTiO_3$—$Pb(Zn_{1/3}Nb_{2/3})O_3$ (BTO-PZN), $BaTiO_3$—$Pb(Sc_{1/2}Nb_{1/2})O_3$ (BTO-PSN). In at least one example, the relaxor ferroelectric material is a PZT based relaxor which includes one of: $PZT$-$Pb(Mg_{1/3}Nb_{2/3})O_3$ (PZT-PMN), $PZT$-$Pb(Ni_{1/3}Nb_{2/3})O_3$ (PZT-PNN), $PZT$-$Pb(Zn_{1/3}Nb_{2/3})O_3$ (PZT-PZN), $PZT$-$Pb(Sc_{1/2}Nb_{1/2})O_3$ (PZT-PSN), $PZT$-$Pb(Fe_{1/2}Nb_{1/2})O_3$ (PZT-PFN), $PZT$-$Pb(La,Zr,Ti)O_3$ (PZT-PLZT), $PZT$-$Pb(Ti,Mn)O_3$ (PZT-PTM). In at least one example, the relaxor ferroelectric material is an $SrBi_2Ta_2O_9$ (SBT) based relaxor which includes one of: paraelectric SBT-$SrBi_2(Nb, Ta)_2O_9$ (SBT-SBNT), SBT doped with transition metals such as Mn, Fe, Co, or SBT doped with one of: La, Ce or Nd, or SBT doped with one of: Ba or Ca. In at least one example, the relaxor ferroelectric material is based on lead magnesium niobate (PMN), lead magnesium niobate-lead titanate (PMN-PT), barium titanium-bismuth zinc niobium tantalum (BT-BZNT), or barium titanium-barium strontium titanium (BT-BST).

In at least one example, the non-linear polar material includes hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). In at least one example, the non-linear polar material includes a hexagonal ferroelectric which includes one of: $YMnO_3$ or $LuFeO_3$.

In at least one example, the non-linear polar material includes a hafnium oxide of form $Hf_{(1-x)}E_{(x)}O_z$, where 'x' denotes a fraction, and E includes one of Al, Ca, Ce, Dy, Er, Gd, Ge, La, Sc, Si, Sr, Sn, Zr, or Y.

In at least one example, the non-linear polar material includes $Al_{(1-x)}Sc_{(x)}N$, $Ga_{(1-x)}Sc_{(x)}N$, $Al_{(1-x)}Y_{(x)}N$ where 'x' and 'y' are respective compositional fractions or $Al_{(a)}Mg_{(b)}Nb_{(c)}N$, where a, b, and c are respective compositional fractions. In at least one example, the non-linear polar material includes one of: $LiNbO_3$, $LiTaO_3$, $LiTaO_2F_2$, $Sr_{(x)}Ba_{(1-x)}Nb_2O_6$ where $0.32 \leq x \leq 0.8$, or $KSr_2Nb_5O_{15}$.

The majority function is performed at the summing node Vs, and the resulting voltage is projected on to capacitance of driver circuitry 101. For example, the majority function of the currents ($I_a$, $I_b$, and $I_c$) on node Vs results in a resultant current that charges the non-linear polar capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |

TABLE 1-continued

| a | b | c | Vs (f(Majority a, b, c)) |
|---|---|---|---|
| 1 | 0 | 0 | 0 |
| 1 | 0 | 1 | 1 |
| 1 | 1 | 0 | 1 |
| 1 | 1 | 1 | 1 |

The charge developed on the summing node Vs produces a voltage and current that is the output of the majority function. Any suitable driver circuitry 101 can drive this output. For example, a non-ferroelectric logic, a ferroelectric logic, a CMOS logic, a BJT logic, etc. can be used to drive the output to a downstream logic. Examples of the drivers include: inverters, buffers, NAND gates, NOR gates, XOR gates, amplifiers, comparators, digital-to-analog converters, analog-to-digital converters, multiplexers, etc.

While FIG. 5 illustrates a 3-input majority gate, the same concept can be extended to more than 3 inputs to make an N-input majority gate, where N is greater than 2. In at least one example, 'N' is an odd number. For example, a 5-input majority gate is similar to an input majority gate 500 but for additional inputs 'd' and 'e'. These inputs can come from the same drivers or from different drivers.

In at least one example, 3-input majority gate 500 can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate 3-input majority gate 500 as an inverter is to set one input to a logic high (e.g., b=1) and set another input to a logic low (e.g., b=0). The third input is the driving input which is to be inverted. The inversion will be at the summing Vs node. The same technique can also be applied to N-input majority gate, where 'N' is 1 or any other odd number. In an N-input majority gate, (N-1)/2 inputs are set to '1' and (N-1)/2 inputs are set to '0', and one input is used to decide the inversion function. It will be appreciated that although the various examples are described as a majority gate, the same concepts are applicable to a minority gate. In a minority gate the driving circuitry is an inverting circuitry coupled to the summing node Vs. The minority function is seen at the output of the inverting circuitry.

In at least one example, (2N-1) input majority gate can operate as an N-input AND gate where (N-1) inputs of the majority gate are set to zero. The AND function will be seen at the summing node Vs. Similarly, N-input NAND, OR, and NOR gates can be realized. In at least one example, the summing node Vs is driven by a driver circuitry (e.g., inverter, buffer, NAND gate, AND gate, OR gate, NOR gate, or any other logic circuitry). However, driver circuitry 101 can be replaced with another majority or minority gate. In at least one example, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots x_n) = \vee_{C_1, C_2 \ldots C_n} (x_1^{C_1} x_2^{C_2} x_3^{C_3} \ldots x_n^{C_n}) \quad (1)$$

where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates ($\wedge$), one for each of the $2^n$ possible combinations of 0 and 1 for $C_1, C_2, \ldots C_n$. The second level of logic is represented by a single OR gate ($\vee$).

Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with at least one example.

Figure 6:
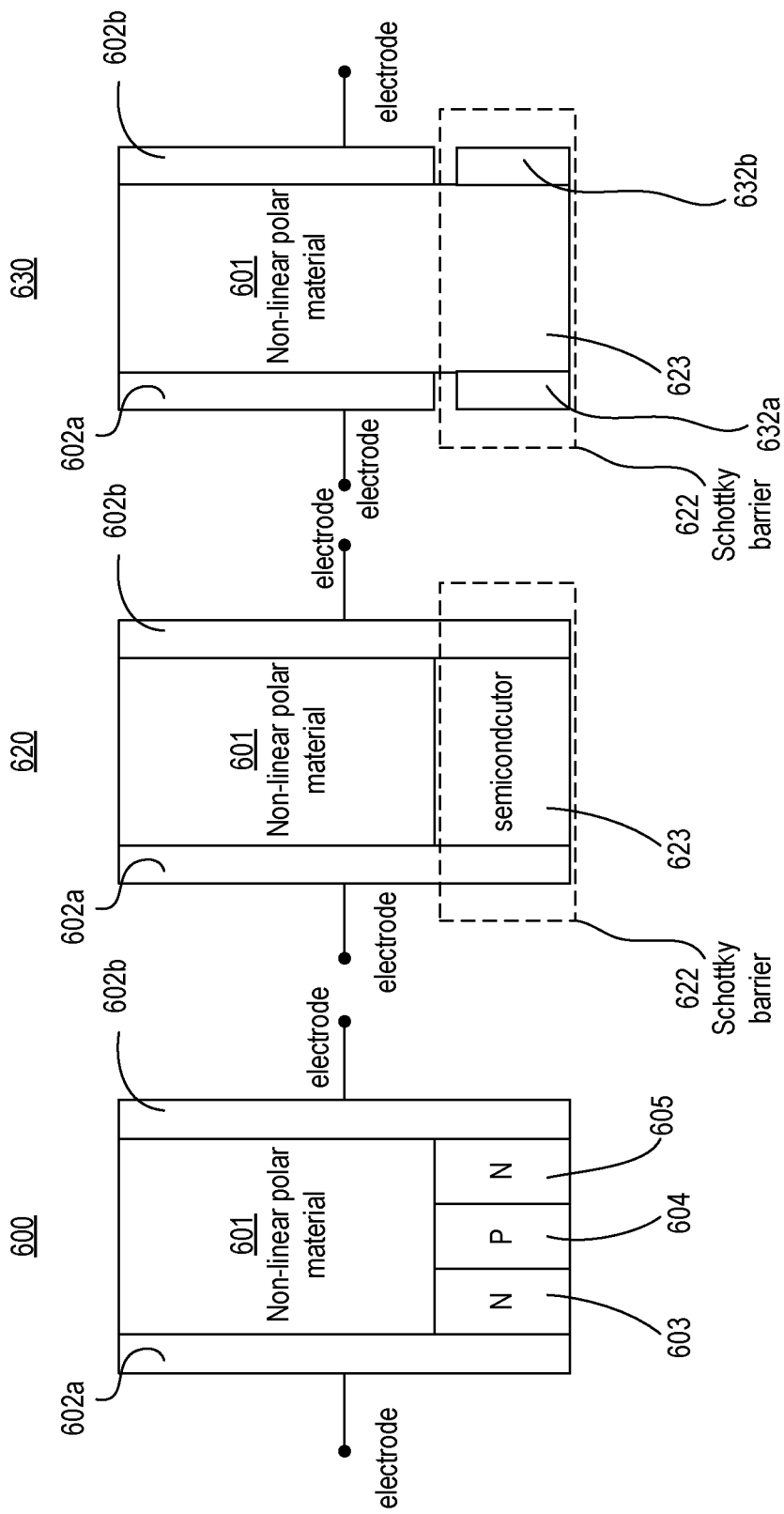
FIG. 6A is a schematic illustrating a cross-sectional view of a device having a non-linear polar capacitor integrated with an n-p-n junction, in accordance with at least one example.
FIG. 6B is a schematic illustrating a cross-sectional view of a device having a non-linear polar capacitor integrated with a Schottky barrier, in accordance with at least one example.
FIG. 6C is a schematic illustrating a cross-sectional view of a device having a non-linear polar capacitor with different electrodes having different work functions to operate as a capacitor in parallel with one or more diodes, in accordance with at least one example.

FIG. 6A is a schematic illustrating a cross-sectional view of a device 600 having a non-linear polar capacitor integrated with an n-p-n junction, in accordance with at least one example. In at least one example, device 600 comprises a non-linear polar material 601, a first electrode 602a, a second electrode 602b, a first n-type material 603, a p-type material 604, and a second n-type material 605. In at least one example, first electrode 602a is coupled to an input while second electrode 602b is coupled to summing node Vs1. In at least one example, first n-type material 603, p-type material 604, and second n-type material 605 together form an n-p-n junction that represents the back-to-back diode arrangement discussed herein. In at least one example, there may be more layers between first electrode 602a and second electrode 602b, where non-linear polar material is between first electrode 602a and second electrode 602b. These additional layers may include conductive oxides, reflective intermetallic material, hydrogen and/or oxygen barriers, etc. In at least one example, device 600 is a planar device. Device 600 may be positioned in the front-end-of-line (FEOL) of a die or a back-end-of-line (BEOL) of a die.

FIG. 6B is a schematic illustrating a cross-sectional view of a device 620 having a non-linear polar capacitor integrated with a Schottky barrier, in accordance with at least one example. In at least one example, first n-type material 603, p-type material 604, and second n-type material 605 are replaced with a junction of a semiconductor material 623 (e.g., Si, Ge, InGaAs, InP, etc.) and a metal material that forms a Schottky barrier 622 adjacent to non-linear polar material 601 and to first electrode 602a and second electrode 602b. In at least one example, the metal materials are Pt, Ir, Ru, Au, Ag, Cu, TaN, TiN. In at least one example, semiconductor material 623 is one of $LaSrMnO_3$, $SrRuO_3$, $NbSrTiO_3$, $BaSnO_3$, $LaBaSnO_3$, or $LaSrCoO_3$. In at least one example, the work functions of first electrode 602a and second electrode 602b can be adjusted or selected to achieve back-to-back diode behavior in semiconductor material 623.

FIG. 6C is a schematic illustrating a cross-sectional view of a device 630 having a non-linear polar capacitor with different electrodes having different work functions to operate as a capacitor in parallel with one or more diodes, in accordance with at least one example. In at least one example, non-linear polar material 601 is non-uniformly doped to establish a region for semiconductor material 623 adjacent to a third electrode 632a and a fourth electrode 632b. In at least one example, the work function of third electrode 632a and fourth electrode 632b is configured so that semiconductor material 623 creates a Schottky barrier 622. In at least one example, third electrode 632a and fourth electrode 632b are connected to first electrode 602a and second electrode 602b.

In at least one example, with reference to FIGS. 6A-C, the non-linear polar material based capacitors are planar capacitors. In at least one example, the non-linear polar material based capacitors are trench or pillar capacitors. In at least one example, the planar capacitors are laterally positioned relative to one another. In at least one example, the planar capacitors are vertically positioned, one on top of the other. In at least one example, the trench or pillar capacitors are laterally positioned relative to one another. In at least one example, the trench or pillar capacitors are vertically positioned, one on top of the other.

Figure 7:
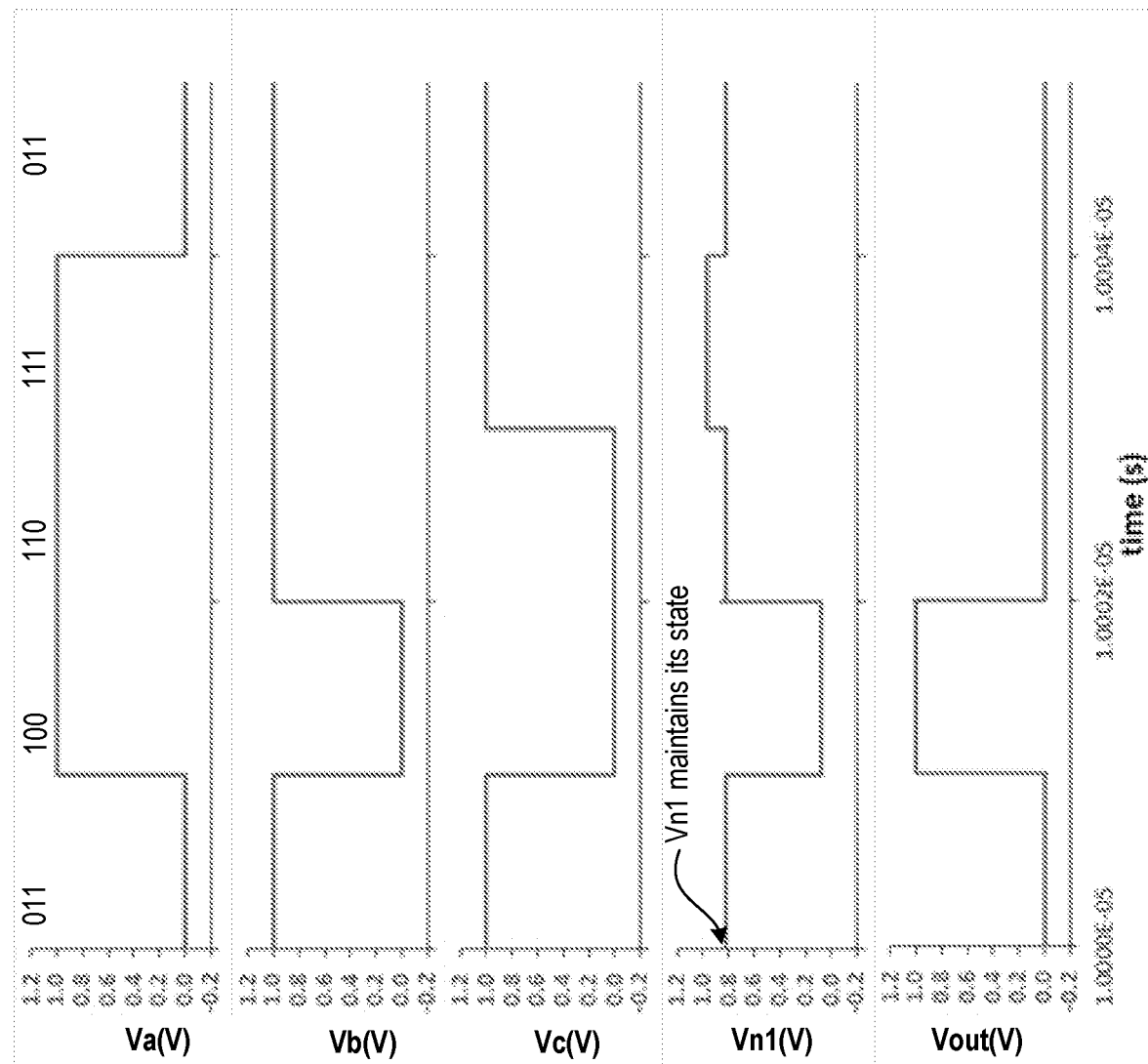
FIG. 7 is a plot showing minority and majority function of the 3-input majority gate having non-linear polar capacitor integrated with back-to-back diodes, in accordance with at least one example.

FIG. 7 is a plot 700 showing minority and majority function of the 3-input majority gate having a non-linear polar capacitor integrated with back-to-back diodes, in accordance with at least one example. Plot 700 is a timing diagram which is a continuum of plot 200 after a long-time break (e.g., 10 µs). The back-to-back diode arrangement in parallel to the non-linear capacitors maintains the charge or voltage on the summing node Vs1. As discussed herein, back-to-back diode arrangement can be replaced with an n-p-n junction or a Schottky diode, in accordance with at least one example.

FIG. 8A is a schematic illustrating a 4-input AND-OR-INVERT complex logic gate (AOI22) cell 800 comprising two 2-input AND gates as majority gates and a CMOS NOR gate 801 having non-linear polar capacitors integrated with back-to-back diodes, in accordance with at least one example. In at least one example, a first AND gate 802 is provided which comprises a set of devices 501a, 502a, and 503a having non-linear capacitors C1n1, C2n1, and C3n1 coupled in parallel to respective back-to-back diodes. Set of devices 501a, 502a, and 503a are same as set of devices 501, 502, and 503 of FIG. 5. Here, a first terminal of capacitor C1n1 receives input a1 while a second terminal of capacitor C1n1 is coupled to a first input of CMOS NOR gate 801. A first terminal of capacitor C2n1 receives input a2 while a second terminal of capacitor C2n1 is coupled to the first input of CMOS NOR gate 801. A first terminal of capacitor C3n1 receives input 0 (e.g., fixed input which is tied to a ground supply rail Vss) while a second terminal of capacitor C3n1 is coupled to the first input of CMOS NOR gate 801. In at least one example, inputs a1 and a2 are variable inputs of the 2-input AND gate. These inputs can be digital, analog, or a combination of them, in accordance with at least one example.

In at least one example, a second AND gate 803 is provided which comprises a set of devices 501b, 502b, and 503b having non-linear capacitors C1n1, C2n1, and C3n1 coupled in parallel to respective back-to-back diodes. A first terminal of capacitor C1n1 receives input b1 while a second terminal of capacitor C1n1 is coupled to the first input of CMOS NOR gate 801. A first terminal of capacitor C2n1 receives input b2 while a second terminal of capacitor C2n1 is coupled to the first input of CMOS NOR gate 801. A first terminal of capacitor C3n1 receives input 0 (e.g., fixed input which is tied to a ground supply rail Vss) while a second terminal of capacitor C3n1 is coupled to the first input of CMOS NOR gate 801. In at least one example, inputs b1 and b2 are variable inputs of the 2-input AND gate. The output of NOR gate 801 is "out" which indicates a complex function of AND-OR-INVERT-2-2. Here, AND-OR-INVERT-2-2 refers to a function with a first AND operation of two inputs a1 and a2 using a first majority gate, a second AND operation of two inputs b1 and b2 using a second majority gate, and 2-input NOR operation on the outputs of the first majority gate and the second majority gate.

The output "out" may also indicate a multiplexer (MUX) function, in accordance with at least one example. In at least one example, a select input signal is used to select between the two other inputs. For example, signal b2 could be a complement of a2. In this scenario, logic gate AOI22 cell 800 works as an inverted MUX to output either a complement of a1 or b1 depending upon the value of a2 signal. For example, if a2 is 1 (in this case b2 would be zero), and the first AND gate gives a1 output and the second AND gate gives 0 output, CMOS NOR gate 801 produces an inversion of the a2 signal.

FIG. 8B is a schematic that illustrates a 6-input AND-OR-INVERT complex logic gate 820 comprising two 3-input AND gates as majority gates and a CMOS NOR gate having non-linear polar capacitors integrated with back-to-back diodes, in accordance with at least one example. Logic gate 820 is like logic gate AOI22 cell 800 but with a larger first AND majority gate 822 and a second AND majority gate 823. Compared to logic gate AOI22 cell 800, here first AND gate 822 includes an additional input a3 coupling with the device 503a having capacitor C3n1 in parallel to back-to-back diodes, device 504a having capacitor C4n1 in parallel to back-to-back diodes, and device 505a having capacitor C5n1 in parallel to back-to-back diodes. A first terminal of capacitor C3n1 is coupled to input a3 while the second terminal of capacitor C3n1 is coupled to CMOS NOR gate 801. A fixed input of logic 0 (e.g., input tied to a ground supply rail) is connected to first terminals of capacitors C4n1 and C5n1 while second terminals of capacitors C4n1 and C5n1 are connected to the first terminal of CMOS NOR gate 801.

Here, second AND gate 823 includes an additional input b3, device 503b having capacitor C3n1 in parallel to back-to-back diodes, device 504b having capacitor C4n1 in parallel to back-to-back diodes, and device 505b having capacitor C5n1 in parallel to back-to-back diodes. A first terminal of capacitor C3n1 is coupled to input b3 while the second terminal of capacitor C3n1 is coupled to a second terminal of CMOS NOR gate 801. A fixed input of logic 0 (e.g., input tied to a ground supply rail) is connected to first terminals of capacitors C4n1 and C5n1 while second terminals of capacitors C4n1 and C5n1 are connected to the second terminal of CMOS NOR gate 801.

The output of CMOS NOR gate 801 of logic gate 820 is "out" which indicates a complex function of AND-OR-INVERT-3-2. Here, AND-OR-INVERT-3-2 refers to a function with a first AND operation of three inputs a1, a2, and a3 using a first majority gate, a second AND operation of three inputs b1, b2, and b3 using a second majority gate, and a 2-input NOR operation on the outputs of the first majority gate and the second majority gate. These inputs can be digital, analog, or a combination of them, in accordance with at least one example.

Figure 8C:
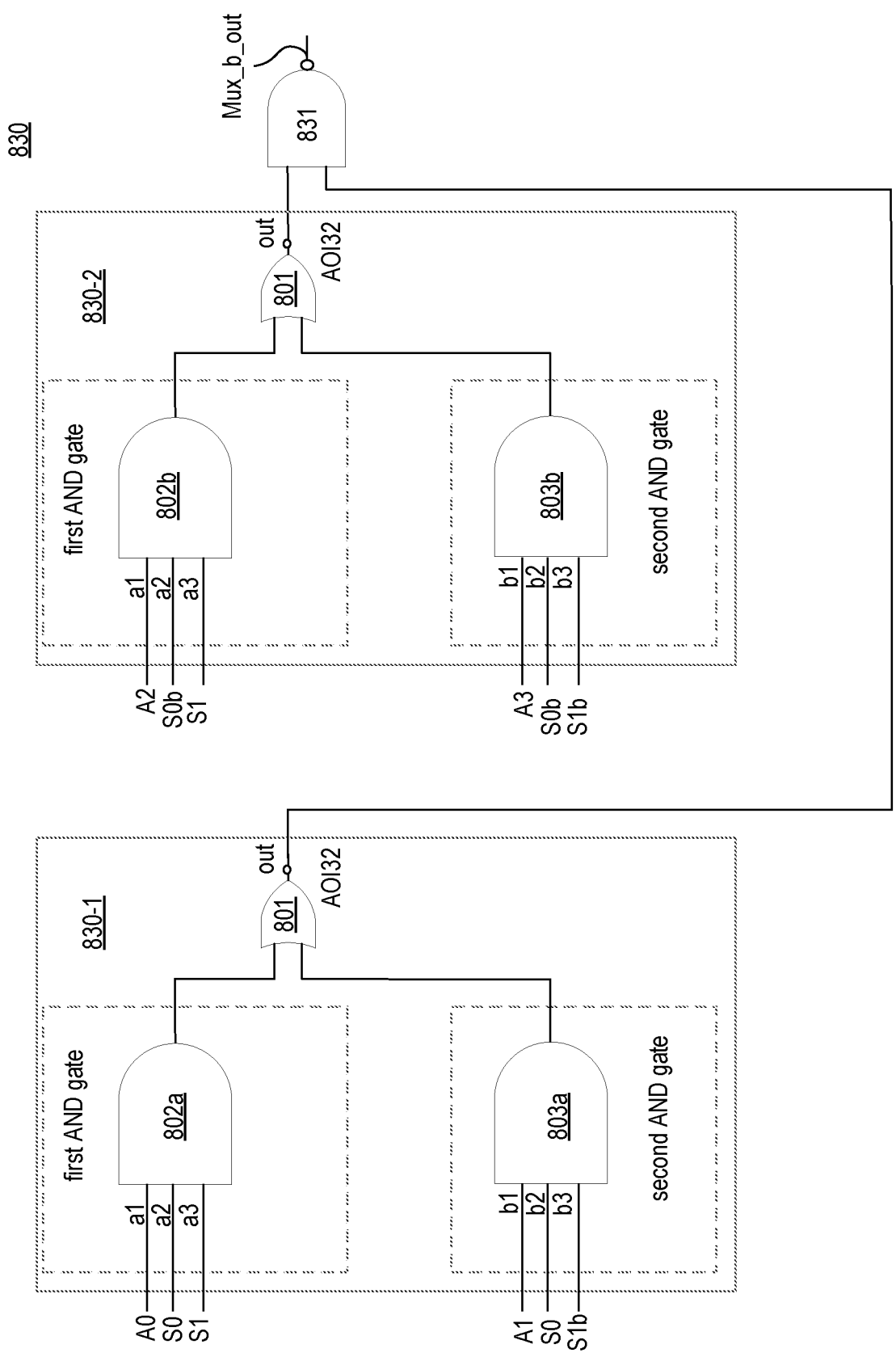
FIG. 8C is a schematic illustrating a 4:1 MUX comprising two instances of AND-OR-INVERT-3-2 gates having non-linear polar capacitors integrated with back-to-back diodes, in accordance with at least one example.

FIG. 8C is a schematic that illustrates a 4:1 multiplexer (MUX) 830 comprising two instances of AND-OR-INVERT-3-2 gates having non-linear polar capacitors integrated with back-to-back diodes, in accordance with at least one example. In at least one example, 4:1 MUX 830 comprises AND-OR-INVERT-3-2 (AOI32) gates (e.g., 830-1 and 830-2 gates) and 2-input NAND gate 831. In at least one example, AOI32 gate 830-1 is an instance of AOI32 gate 820, and likewise AOI32 gate 830-2 is an instance of AOI32 gate 820.

In at least one example, the output Mux_b_out may indicate an inverted multiplexer (MUX) function. In at least one example, NAND gate 831 is a CMOS based NAND gate. In at least one example, NAND gate 831 comprises capacitors with non-linear polar material. In one such case, NAND gate 831 is like the AND gate of the AND-OR-INVERT-3-2 followed by an inverter with input connected to the summing node.

In at least one example, multiplexer selection signals and their complement signals can be applied to inputs a2, a3, b2, and b3 to control the selection of the outputs. An individual AND gate receives a different set of select inputs to allow 4:1 MUX operation, where one input from among four inputs is selected as output Mux_b_out.

In at least one example, input a1 of gate 830-1 receives input A0 while inputs a2 and a3 of first AND gate 802a of gate 830-1 receives select signals S0 and S1, respectively. For the same gate, input b1 of gate 830-1 receives input A1 while inputs b2 and b3 of second AND gate 803a of gate 830-1 receives complementary select signals S0 and S1b, respectively.

Likewise, input a1 of gate 830-2 receives input A2 while inputs a2 and a3 of first AND gate 802b of gate 830-2 receives select signals S0b and S1, respectively. For the same gate, input b1 of gate 830-2 receives input A3 while inputs b2 and b3 of second AND gate 803b of gate 830-2 receives select signals S0b and S1b, respectively.

Note, select signals S0b and S1b are complementary to select signals S0 and S1, respectively. The output of each AOI32 gate is an inverted signal of a1 or b1 depending on the logic values of the select signals, in accordance with at least one example. As such, a 4:1 multiplexer is formed which has a shorter delay than a comparable CMOS-only 4:1 digital multiplexer and smaller area. In at least one example, the delay and area improve by 1.5× compared to a 4:1 CMOS-only multiplexer.

FIG. 8D is a schematic which illustrates an 8-input AND-OR-INVERT complex logic gate 840 comprising two 4-input AND gates 841-1 and 841-2 as majority gates and a CMOS NOR gate having non-linear polar capacitors integrated with back-to-back diodes, in accordance with at least one example. Logic gate 840 is like logic gate 820 but with a larger first AND majority gate 841-1 and second AND majority gate 841-2.

Compared to logic gate 820, here the first AND gate 841-1 includes an additional input a4, device 504a having capacitor C4n1 parallel to back-to-back diodes, device 505a having capacitor C5n1 parallel to back-to-back diodes, device 506a having capacitor C6n1 parallel to back-to-back diodes, and device 507a having capacitor C7n1 parallel to back-to-back diodes.

In at least one example, a first terminal of capacitor C4n1 is coupled to input a4 while the second terminal of capacitor C4n1 is coupled to CMOS NOR gate 801. A fixed input of logic 0 (e.g., input tied to a ground supply rail) is connected to first terminals of capacitors C5n1, C6n1, and C7n1 while second terminals of capacitors C5n1, C6n1, and C7n1 of first AND gate 841-1 are connected to the first terminal of CMOS NOR gate 801.

Compared to logic gate 820, here the second AND gate 841-2 includes an additional input b4, device 504b having capacitor C4n1 parallel to back-to-back diodes, device 505b having capacitor C5n1 parallel to back-to-back diodes, device 506b having capacitor C6n1 parallel to back-to-back diodes, and device 507b having capacitor C7n1 parallel to back-to-back diodes. A first terminal of capacitor C4n1 is coupled to input b4 while the second terminal of capacitor C4n1 is coupled to a second terminal of CMOS NOR gate 801. A fixed input of logic 0 (e.g., input tied to a ground supply rail) is connected to first terminals of capacitors C5n1, C6n1, and C7n1 while second terminals of capacitors C5n1, C6n1, and C7n1 of second AND gate 841-2 are connected to the second terminal of CMOS NOR gate 801.

The output of CMOS NOR gate 801 of logic gate 840 is "out" which indicates a complex function of AND-OR- INVERT-4-2. Here, AND-OR-INVERT-4-2 refers to a function with a first AND operation of four inputs a1, a2, a3, and a4 using a first majority gate, a second AND operation of four inputs b1, b2, b3, and b4 using a second majority gate, and a 2-input NOR operation on the outputs of the first majority gate and the second majority gate. These inputs can be digital, analog, or a combination of them, in accordance with at least one example.

Figure 8E:
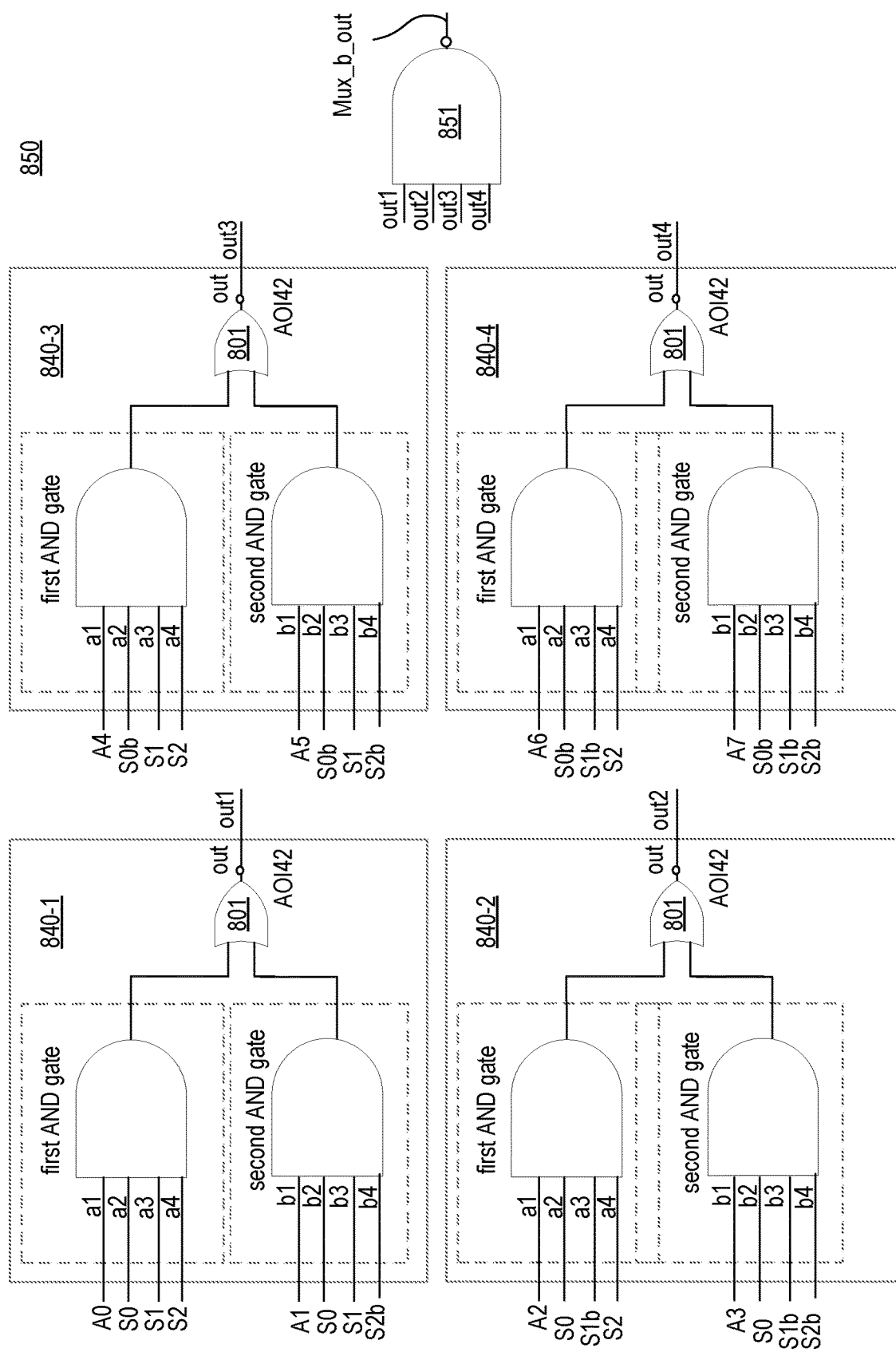
FIG. 8E is a schematic illustrating an 8:1 MUX comprising four instances of AND-OR-INVERT-4-2 gates having non-linear polar capacitors integrated with back-to-back diodes, in accordance with at least one example.

FIG. 8E is a schematic which illustrates an 8:1 MUX 850 comprising four instances of AND-OR-INVERT-4-2 gates having non-linear polar capacitors integrated with back-to-back diodes, in accordance with at least one example. In at least one example, 8:1 MUX 850 comprises AND-OR-INVERT-4-2 (AOI42) gates (e.g., 840-1, 840-2, 840-3, and 840-4 gates) and NAND gate 851. In at least one example, NAND gate 851 is a CMOS based NAND gate. In at least one example, NAND gate 851 comprises capacitors with non-linear polar material. In one such case, the NAND gate 851 is like the AND gate of the AND-OR-INVERT-4-2 followed by an inverter with input connected to the summing node. In at least one example, the outputs out1, out2, out3, and out4 of gates 840-1, 840-2, 840-3, and 840-4 are input to 4-input NAND gate 851. The output Mux_b_out of 4-input NAND gate 851 is the inverted multiplexer output. In at least one example, for each AOI42 gate, inputs a2, a3, a4, b2, b3, b4 can be tied to select signals or their complements as shown. An individual AND gate receives a different set of select inputs to allow 8:1 MUX operation, where one input from among eight inputs is selected as output Mux_b_out. In at least one example, 4-input NAND gate 851 is also implemented as a majority gate using non-linear input capacitors. In at least one example, the summing node Vs is coupled to an inverter which becomes the output of the majority gate based 4-input NAND gate 851.

In at least one example, multiplexer selection signals and their complement signals can be applied to inputs a2, a3, a4, b2, b3, and b4 such that each AND gate receives a different set of inputs. This allows the 8:1 multiplexer operation.

In at least one example, input a1 of gate 840-1 receives input A0 while inputs a2, a3, and a4 of first AND gate of gate 840-1 receives select signals S0, S1, and S2 respectively. For the same gate, input b1 of gate 840-1 receives input A1 while inputs b2, b3, and b4 of second AND gate of gate 840-1 receives select signals S0, S1, and S2*b*, respectively. Note, select signals S0*b*, S1*b*, and S2*b* are complementary to select signals S0, S1, and S2, respectively.

In at least one example, input a1 of gate 840-2 receives input A2 while inputs a2, a3, and a4 of first AND gate of gate 840-2 receives select signals S0, S1*b*, and S2, respectively. For the same gate, input b1 of gate 840-2 receives input A3 while inputs b2, b3, and b4 of second AND gate of gate 840-2 receives select signals S0, S1*b*, and S2*b*, respectively.

In at least one example, input a1 of gate 840-3 receives input A4 while inputs a2, a3, and a4 of first AND gate of gate 840-3 receives select signals S0*b*, S1, and S2, respectively. For the same gate, input b1 of gate 840-3 receives input A5 while inputs b2, b3, and b4 of second AND gate of gate 840-3 receives select signals S0*b*, S1, and S2*b*, respectively.

In at least one example, input a1 of gate 840-4 receives input A6 while inputs a2, a3, and a4 of first AND gate of gate 840-4 receives select signals S0*b*, S1*b*, and S2, respectively. For the same gate, input b1 of gate 840-4 receives input A7 while inputs b2, b3, and b4 of second AND gate of gate 840-4 receives select signals S0*b*, S1*b*, and S2*b*, respectively.

As such, an 8:1 multiplexer is formed which has shorter delay than a comparable CMOS-only 8:1 digital multiplexer and smaller area. In at least one example, the delay and area improve by 1.5× compared to an 8:1 CMOS multiplexer.

Figure 8F:
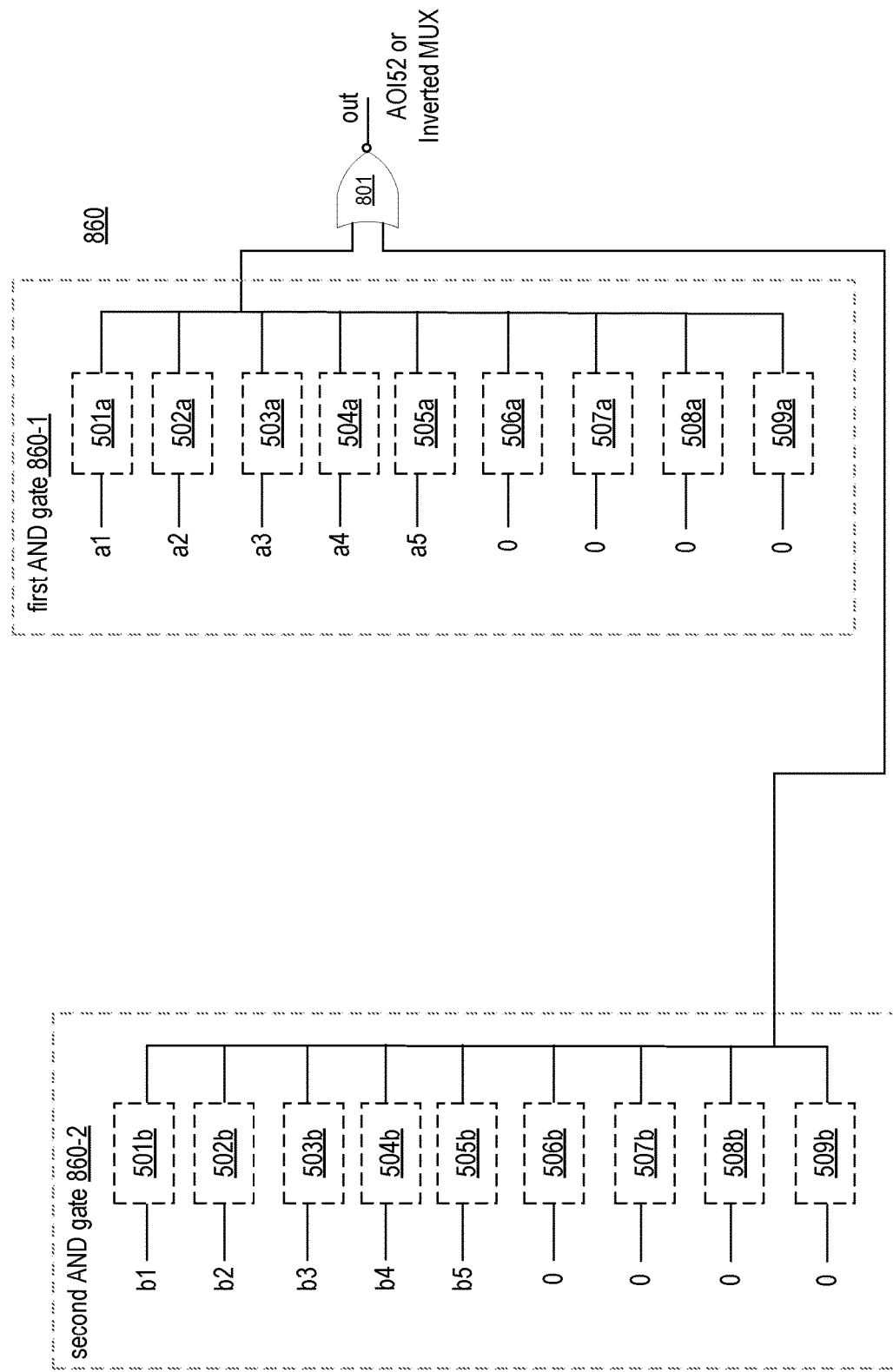
FIG. 8F is a schematic illustrating a 10-input AND-OR-INVERT complex logic gate comprising two 5-input AND gates as majority gates and a CMOS NOR gate having non-linear polar capacitors integrated with back-to-back diodes, in accordance with at least one example.

FIG. 8F is a schematic which illustrates a 10-input AND-OR-INVERT complex logic gate 860 comprising two 5-input AND gates as majority gates and a CMOS NOR gate having non-linear polar capacitors integrated with back-to-back diodes, in accordance with at least one example. Logic gate 860 is like logic gate 840 but with a larger first AND majority gate 860-1 and second AND majority gate 860-2. Compared to logic gate 840, here first AND gate 860-1 includes an additional input a5, device 505*a* having capacitor C5*n*1 parallel to back-to-back diodes, device 506*a* having capacitor C6*n*1 parallel to back-to-back diodes, device 507*a* having capacitor C7*n*1 parallel to back-to-back diodes, device 508*a* having capacitor C8*n*1 parallel to back-to-back diodes, and device 509*a* having capacitor C9*n*1 parallel to back-to-back diodes. A first terminal of capacitor C5*n*1 is coupled to input a5 while the second terminal of capacitor C5*n*1 is coupled to a first terminal of NOR gate 801. A fixed input of logic 0 (e.g., input tied to a ground supply rail) is connected to first terminals of capacitors C6*n*1, C7*n*1, C8*n*1, and C9*n*1 while second terminal of capacitors C6*n*1, C7*n*1, C8*n*1, and C9*n*1 are connected to the first terminal of CMOS NOR gate 801.

Here, second AND gate 860-2 includes additional input b5, device 505*b* having capacitor C5*n*1 parallel to back-to-back diodes, device 506*b* having capacitor C6*n*1 parallel to back-to-back diodes, device 507*b* having capacitor C7*n*1 parallel to back-to-back diodes, device 508*b* having capacitor C8*n*1 parallel to back-to-back diodes, and capacitor C9*n*1. A first terminal of capacitor C5*n*1 is coupled to input b5 while the second terminal of capacitor C5*n*1 is coupled to a second terminal of CMOS NOR gate 801. A fixed input of logic 0 (e.g., input tied to a ground supply rail) is connected to first terminals of capacitors C6*n*1, C7*n*1, C8*n*1, and C9*n*1 while second terminals of capacitors C6*n*1, C7*n*1, C8*n*1, and C9*n*1 of second AND gate 860-2 is connected to the second terminal of CMOS NOR gate 801.

The output of CMOS NOR gate 801 of logic gate 860 is "out" which indicates a complex function of AND-OR-INVERT-5-2. Here, AND-OR-INVERT-5-2 refers to a function with a first AND operation of four inputs a1, a2, a3, a4, and a5 using a first AND gate, a second AND operation of four inputs b1, b2, b3, b4, and b5 using second AND gate, and a 2-input NOR operation on the outputs of the first AND gate and the second AND gate. These inputs can be digital, analog, or a combination of them, in accordance with at least one example. Like other AOI gates discussed here, AND-OR-INVERT-5-2 can also be configured as a multi-input multiplexer using the same concepts as discussed with reference to FIG. 8C and FIG. 8D.

Figures 9A, 9B:
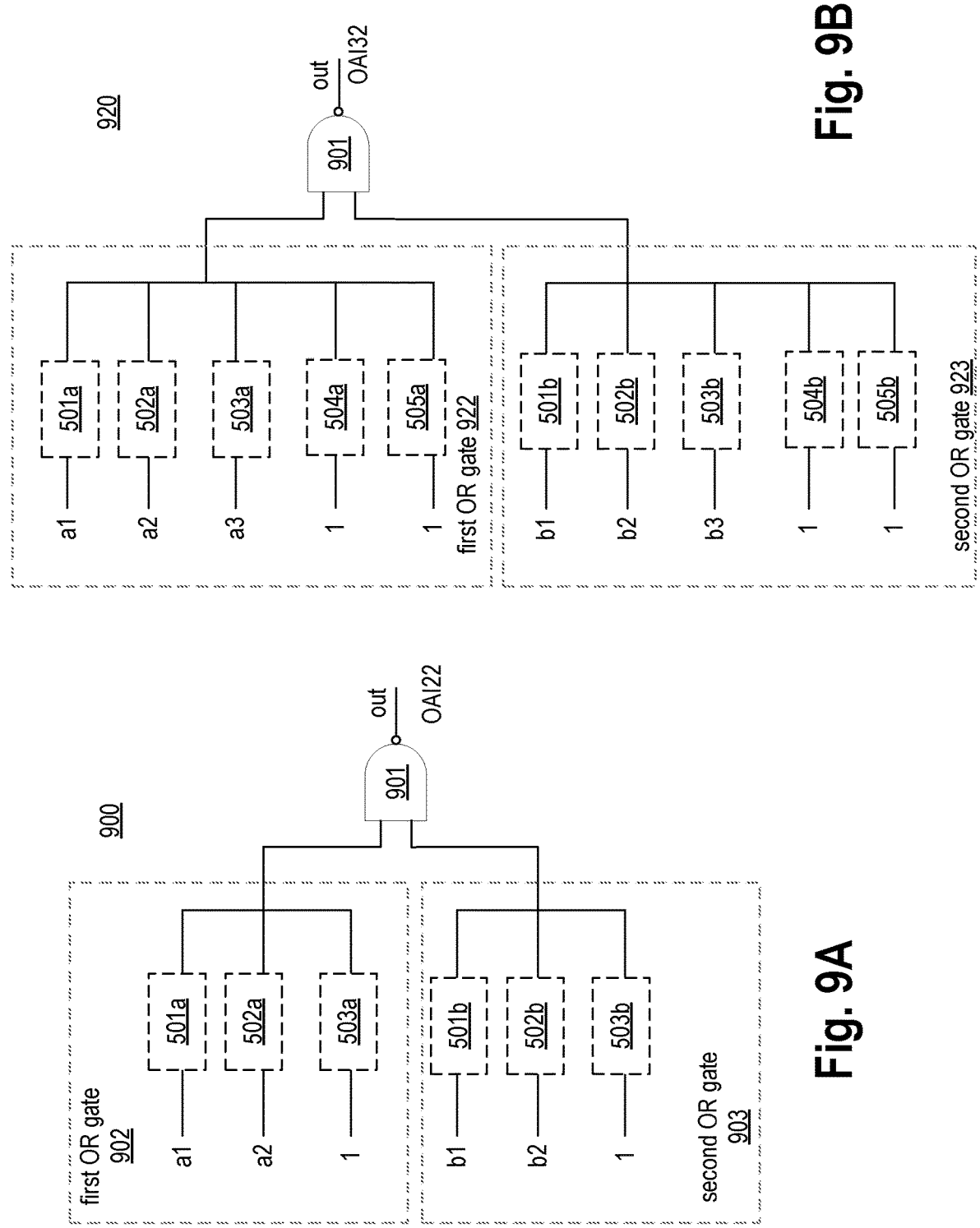
FIG. 9A is a schematic illustrating a 4-input OR-AND-INVERT complex logic gate comprising two 2-input OR gates as majority gates and a CMOS NAND gate having non-linear polar capacitors integrated with back-to-back diodes, in accordance with at least one example.
FIG. 9B is a schematic illustrating a 6-input OR-AND-INVERT complex logic gate comprising two 3-input OR gates as majority gates and a CMOS AND gate having non-linear polar capacitors integrated with back-to-back diodes, in accordance with at least one example.

FIG. 9A is a schematic illustrating a 4-input OR-AND-INVERT (OAI22) complex logic gate 900 comprising two 2-input OR gates as majority gates and a CMOS NAND gate 901 having non-linear polar capacitors integrated with back-to-back diodes, in accordance with at least one example. In at least one example, a first OR gate 902 is provided which comprises a set of devices 501*a*, 502*a*, and 503*a* having non-linear capacitors C1*n*1, C2*n*1, and C3*n*1 in parallel with corresponding back-to-back diodes, respectively. A first terminal of capacitor C1*n*1 receives input a1 while a second terminal of capacitor C1*n*1 is coupled to a first input of NAND gate 901. A first terminal of capacitor C2*n*1 receives input a2 while a second terminal of capacitor C2*n*1 is coupled to the first input of NAND gate 901. A first terminal of capacitor C3*n*1 receives input 1 (e.g., fixed input which is tied to a power supply rail Vdd) while a second terminal of capacitor C3n1 is coupled to the first input of NAND gate 901. In at least one example, inputs a1 and a2 are variable inputs of the 2-input OR gate.

In at least one example, a second OR gate 903 is provided which comprises set of devices 501b, 502b, and 503b having non-linear capacitors C1n1, C2n1, and C3n1 in parallel with corresponding back-to-back diodes, respectively. A first terminal of capacitor C1n1 receives input b1 while a second terminal of capacitor C1n1 is coupled to the first input of NAND gate 901. A first terminal of capacitor C2n1 receives input b2 while a second terminal of capacitor C2n1 is coupled to the first input of NAND gate 901. A first terminal of capacitor Cb3 receives input 1 (e.g., fixed input which is tied to a power supply rail Vdd) while a second terminal of capacitor C3n1 is coupled to the first input of NAND gate 901. In various embodiments, inputs b1 and b2 are variable inputs of the 2-input OR gate. The output of NAND gate 901 is "out" which indicates a complex function of OR-AND-INVERT-2-2. Here, OR-AND-INVERT-2-2 refers to a function with a first OR operation of two inputs a1 and a2 using a first majority gate, a second OR operation of two inputs b1 and b2 using a second majority gate, and 2-input NAND operation by NAND gate 901 on the outputs of the first majority gate and the second majority gate. These inputs can be digital, analog, or a combination of them, in accordance with at least one example.

FIG. 9B is a schematic illustrating a 6-input OR-AND-INVERT complex logic gate 920 comprising two 3-input OR gates as majority gates and a CMOS AND gate having non-linear polar capacitors integrated with back-to-back diodes, in accordance with at least one example. Logic gate 920 is like logic gate 900 but with a larger first OR majority gate 922 and second OR majority gate 923. Compared to logic gate 900, here first OR gate 922 includes an additional input a3 device 503a having capacitor C3n1 parallel with back-to-back diodes, device 504a having capacitor C4n1 parallel with back-to-back diodes, and device 505a having capacitor C5n1 parallel with back-to-back diodes. A first terminal of capacitor C3n1 is coupled to input a3 while the second terminal of capacitor C3n1 is coupled to NAND gate 901. A fixed input of logic 1 (e.g., fixed input which is tied to a power supply rail) is connected to first terminals of capacitors C4n1 and C5n1 while second terminals of capacitors C4n1 and C5n1 are connected to the first terminal of NAND gate 901.

Here, second OR gate 923 includes an additional input b3, device 503b having capacitor C3n1 parallel to back-to-back diodes, device 504b having capacitor C4c1 parallel to back-to-back diodes, and device 505b having capacitor C5c1 parallel to back-to-back diodes. A first terminal of capacitor C3n1 is coupled to input b3 while the second terminal of capacitor C3n1 is coupled to a second terminal of NAND gate 901. A fixed input of logic 1 (e.g., fixed input which is tied to a power supply rail Vdd) is connected to first terminals of capacitors C4n1 and C5n1 while second terminals of capacitor C4n1 and C5n1 of second OR gate 923 are connected to the second terminal of NAND gate 901.

The output of NAND gate 901 of logic gate 920 is "out" which indicates a complex function of OR-AND-INVERT-3-2. Here, OR-AND-INVERT-3-2 refers to a function with a first OR operation of three inputs a1, a2, and a3 using a first majority gate, a second OR operation of three inputs b1, b2, and b3 using a second majority gate, and a 2-input NAND operation on the outputs of the first majority gate and the second majority gate. These inputs can be digital, analog, or a combination of them, in accordance with at least one example.

Figure 9C:
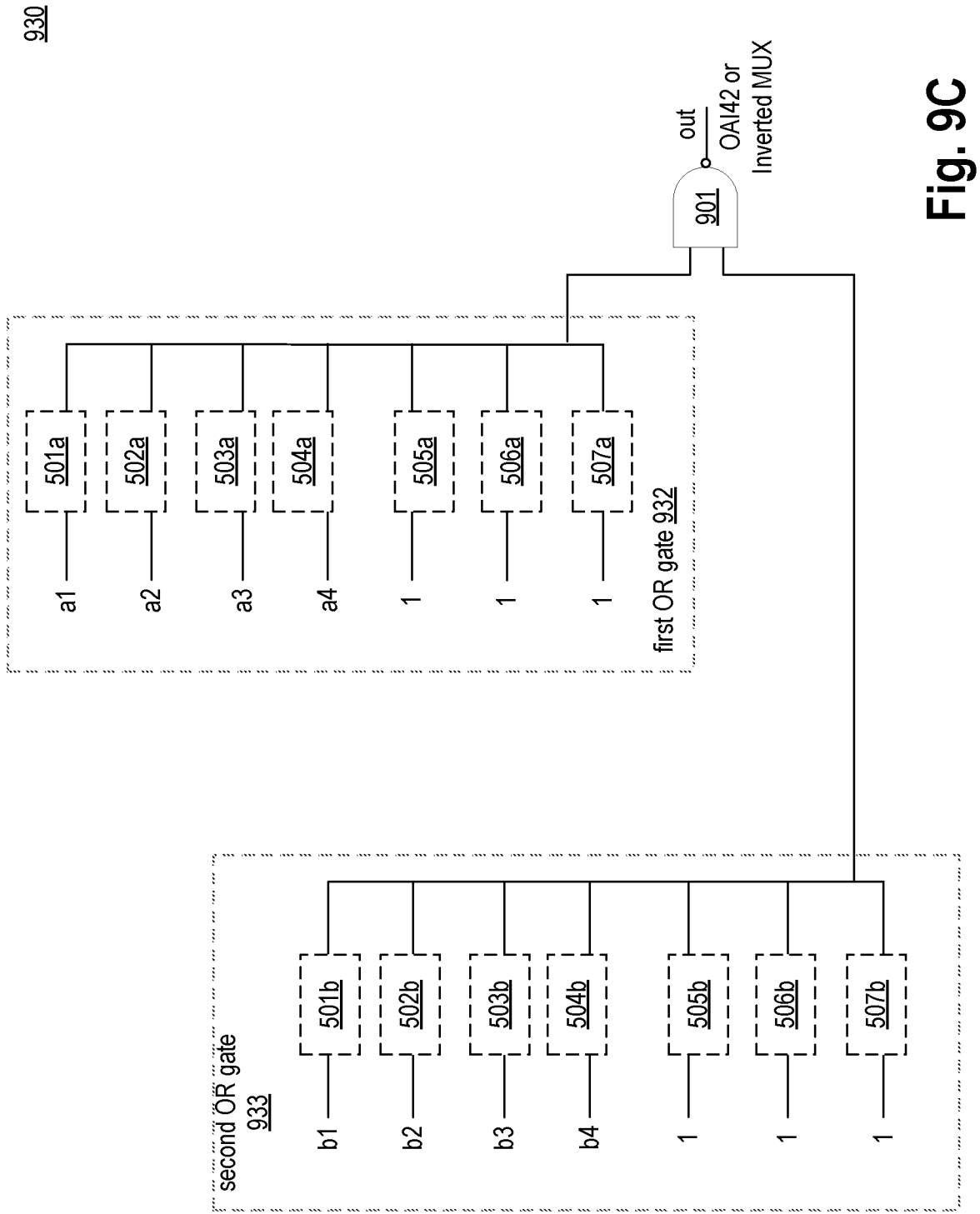
FIG. 9C is a schematic illustrating an 8-input OR-AND-INVERT complex logic gate comprising two 4-input OR gates as majority gates and a CMOS AND gate having non-linear polar capacitors integrated with back-to-back diodes, in accordance with at least one example.

FIG. 9C is a schematic illustrating an 8-input OR-AND-INVERT complex logic gate 930 comprising two 4-input OR gates as majority gates and a CMOS AND gate having non-linear polar capacitors integrated with back-to-back diodes, in accordance with at least one example. Logic gate 930 is like logic gate 920 but with a larger first OR majority gate 932 and second OR majority gate 933. Compared to logic gate 920, here first OR gate 932 includes an additional input a4, device 504a having capacitor C4n1 parallel to back-to-back diodes, device 505a having capacitor C5n1 parallel to back-to-back diodes, device 506a having capacitor C6n1 parallel with back-to-back diodes, and device 507a having capacitor C7n1 parallel with back-to-back diodes. A first terminal of capacitor C4n1 is coupled to input a4 while the second terminal of capacitor C4n1 is coupled to NAND gate 901. A fixed input of logic 1 (e.g., fixed input which is tied to a power supply rail) is connected to first terminals of capacitors C5n1, C6n1, and C7n1 while second terminals of capacitors C5n1, C6n1, and C7n1 of first OR gate 932 is connected to the first terminal of NAND gate 901.

Here, second OR gate 933 includes additional input b4 and device 504b having capacitor C4n1 parallel with back-to-back diodes, device 505b having capacitor C5n1 parallel with back-to-back diodes, device 506b having capacitor C6n1 parallel with back-to-back diodes, and device 507b having capacitor C7n1 parallel with back-to-back diodes. A first terminal of capacitor C4n1 is coupled to input b4 while the second terminal of capacitor C4n1 is coupled to a second terminal of NAND gate 901. A fixed input of logic 1 (e.g., fixed input which is tied to a power supply rail) is connected to first terminals of capacitors C5n1, C6n1, and C7n1 while second terminals of capacitors C5n1, C6n1, and C7n1 of second OR gate 933 is connected to the second terminal of NAND gate 901.

The output of NAND gate 901 of logic gate 930 is "out" which indicates a complex function of OR-AND-INVERT-4-2. Here, OR-AND-INVERT-4-2 refers to a function with a first OR operation of four inputs a1, a2, a3, and a4 using a first majority gate, a second OR operation of four inputs b1, b2, b3, and b4 using a second majority gate, and a 2-input NAND operation on the outputs of the first majority gate and the second majority gate. These inputs can be digital, analog, or a combination of them, in accordance with at least one example.

Figure 9D:
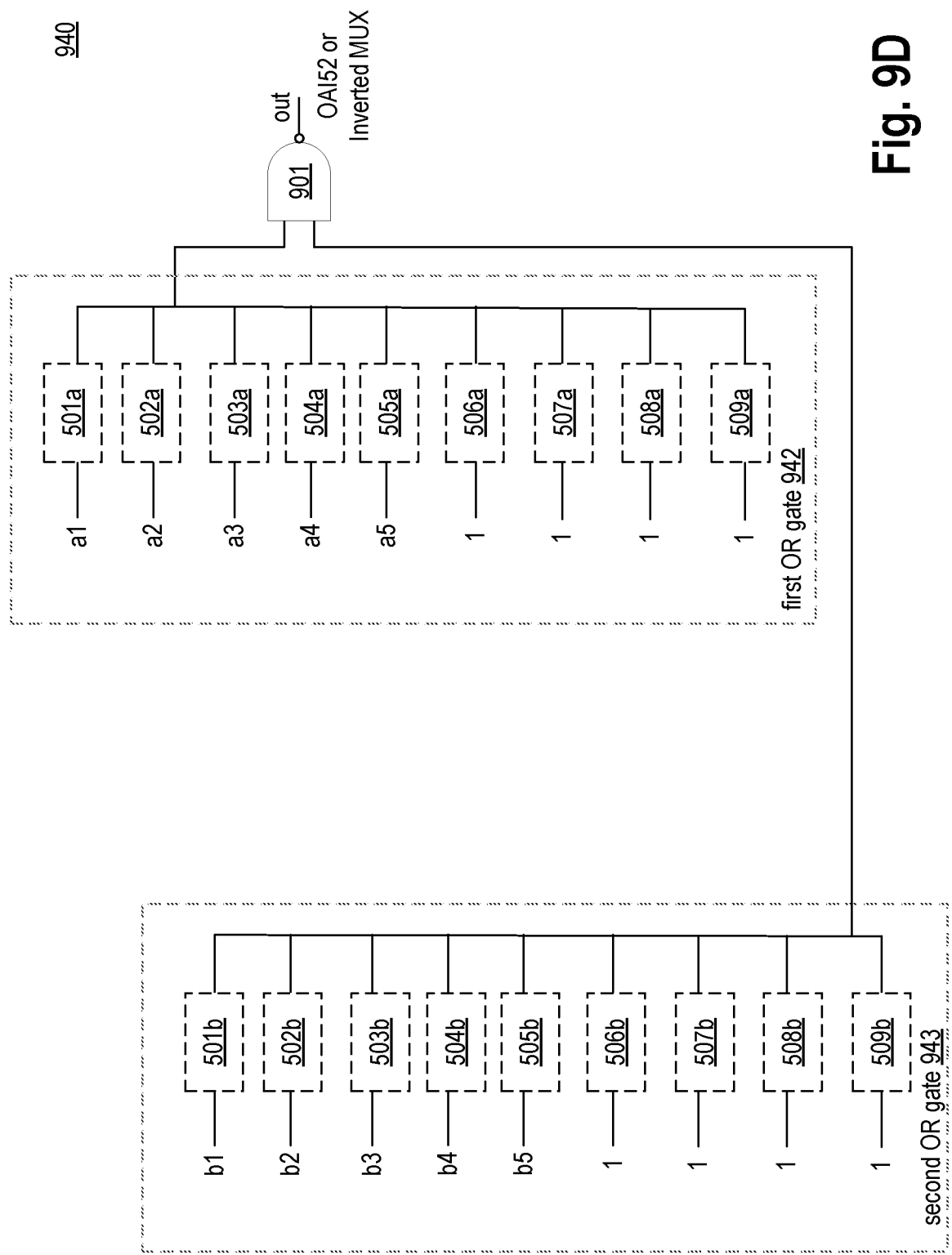
FIG. 9D is a schematic illustrating a 10-input OR-AND-INVERT complex logic gate comprising two 5-input OR gates as majority gates and a CMOS AND gate having non-linear polar capacitors integrated with back-to-back diodes, in accordance with at least one example.

FIG. 9D is a schematic illustrating a 10-input OR-AND-INVERT complex logic gate 940 comprising two 5-input OR gates as majority gates and a CMOS AND gate having non-linear polar capacitors integrated with back-to-back diodes, in accordance with at least one example. Logic gate 940 is like logic gate 930 but with a larger first OR majority gate 942 and second OR majority gate 943. Compared to logic gate 930, here the first OR gate 942 includes an additional input a5, device 505a having capacitor C5n1 parallel to back-to-back diodes, device 506a having capacitor C6n1 parallel to back-to-back diodes, device 507a having capacitor C7n1 parallel to back-to-back diodes, device 508a having capacitor C8n1 parallel to back-to-back diodes, and device 509a having capacitor C9n1 parallel to back-to-back diodes. A first terminal of capacitor C5n1 is coupled to input a5 while the second terminal of capacitor C5n1 is coupled to a first terminal of NAND gate 901. A fixed input of logic 1 (e.g., fixed input which is tied to a power supply rail) is connected to first terminals of capacitors C6n1, C7n1, C8n1, and C9n1 while second terminals of capacitors C6n1, C7n1, C8n1, and C9n1 of first OR gate 942 are connected to the first terminal of NAND gate 901.

Here, the second OR gate 943 includes additional input b5 and device 505b having capacitor C5n1 parallel to back-to-back diodes, device 506b having capacitor C6n1 parallel to back-to-back diodes, device 507b having capacitor C7n1 parallel to back-to-back diodes, device 508b having capacitor C8n1 parallel to back-to-back diodes, and device 509b having capacitor C9n1 parallel to back-to-back diodes. A first terminal of capacitor C5n1 is coupled to input b5 while the second terminal of capacitor C5n1 of second OR gate 943 is coupled to a second terminal of NAND gate 901. A fixed input of logic 1 (e.g., fixed input which is tied to a power supply rail) is connected to first terminals of capacitors C6n1, C7n1, C8n1, and C9n1 while second terminals of capacitors C6n1, C7n1, C8n1, and C9n1 of second OR gate 943 are connected to the second terminal of NAND gate 901. The output of NAND gate 901 of logic gate 940 is "out" which indicates a complex function of OR-AND-INVERT-5-2. Here, OR-AND-INVERT-5-2 refers to a function with a first OR operation of four inputs a1, a2, a3, a4, and a5 using a first majority gate, a second OR operation of four inputs b1, b2, b3, b4, and b5 using a second majority gate, and a 2-input NAND operation on the outputs of the first majority gate and the second majority gate. These inputs can be digital, analog, or a combination of them, in accordance with at least one example.

Figure 10:
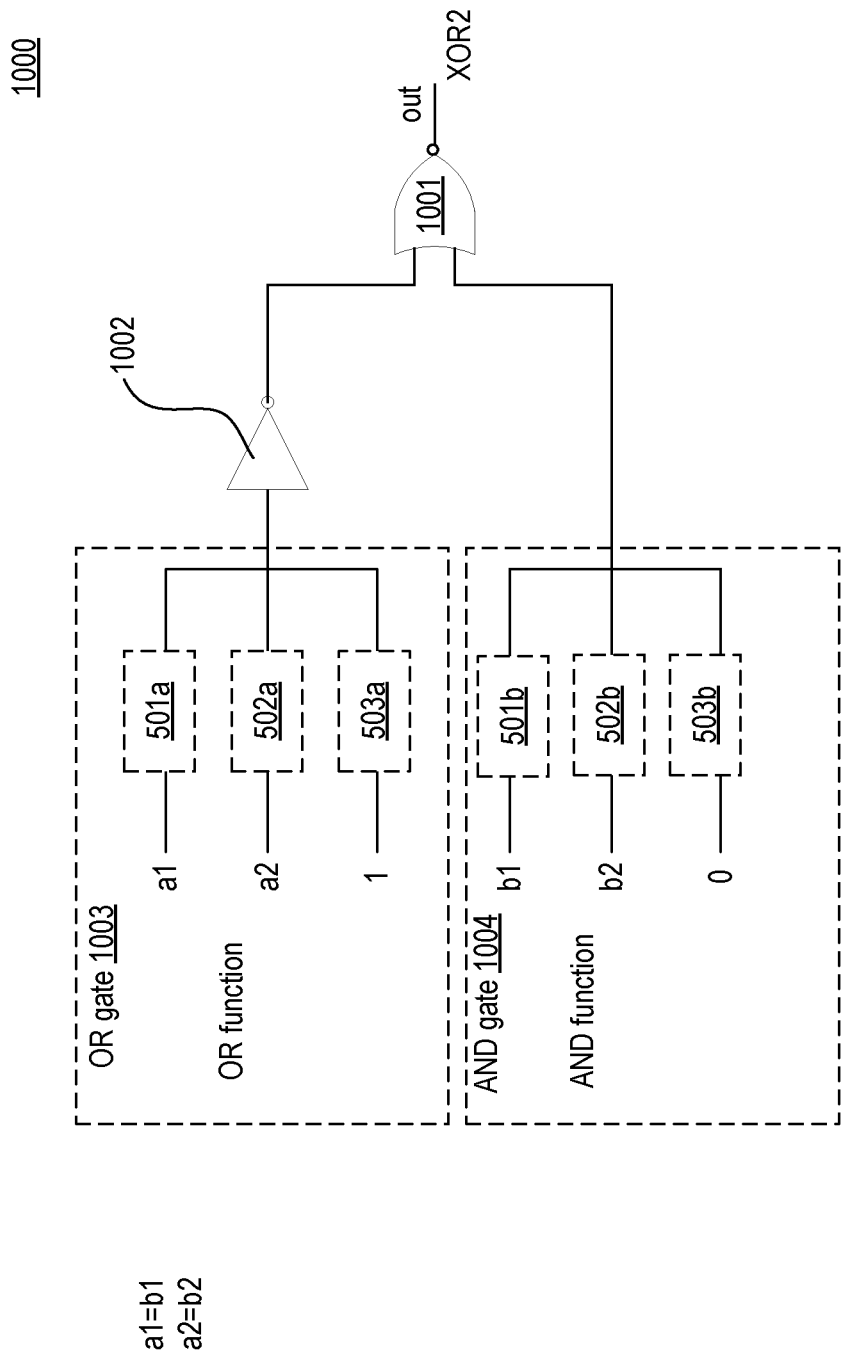
FIG. 10 is a schematic illustrating a 4-input XOR gate comprising a 2-input OR gate as a majority gate and a 2-input NOR gate as a majority gate having non-linear polar capacitors integrated with back-to-back diodes, in accordance with at least one example.

FIG. 10 is a schematic illustrating a 4-input XOR gate 1000 comprising a 2-input OR gate as a majority gate and a 2-input NOR gate as a majority gate having non-linear polar capacitors integrated with back-to-back diodes, in accordance with at least one example, XOR gate 1000 further comprises NOR gate 1001 and inverter 1002. Here, the 2-input OR gate 1003 comprises devices 501a, 502a, and 503a having capacitors C1n1, C2n1, and C3n1 and associated back-to-back diodes in parallel, respectively. A first terminal of capacitor C1n1 is coupled to input a1 while a second terminal of capacitor C1n1 is coupled to an input of inverter 1002. A first terminal of capacitor C2n1 is coupled to input a2 while a second terminal of capacitor C2n1 is coupled to the input of inverter 1002. A first terminal of capacitor C3n1 is coupled to a fixed input 1 (e.g., input tied to a power supply rail) while a second terminal of capacitor C3n1 is coupled to the input of inverter 1002. The output of inverter 1002 is coupled to a first input of NOR gate 1001.

Here, the 2-input AND gate 1004 comprises devices 501b, 502b, and 503b having capacitors C1n1, C2n1, and C3n1 and associated back-to-back diodes in parallel, respectively. A first terminal of capacitor C1n1 is coupled to input b1 while a second terminal of capacitor C1n1 is coupled to a second input of NOR gate 1001. A first terminal of capacitor C2n1 is coupled to input b2 while a second terminal of capacitor C2n1 is coupled to the second input of NOR gate 1001. A first terminal of capacitor C3n1 is coupled to a fixed input 0 (e.g., input tied to a ground supply rail) while a second terminal of capacitor C3n1 of 2-input AND gate 1004 is coupled to the second input of NOR gate 1001. The output of NOR gate 1001 is "out" which is the XOR function of inputs a1 and a2, where a1 and b1 receive the same input while a2 and b2 receive the same input.

Figure 11:
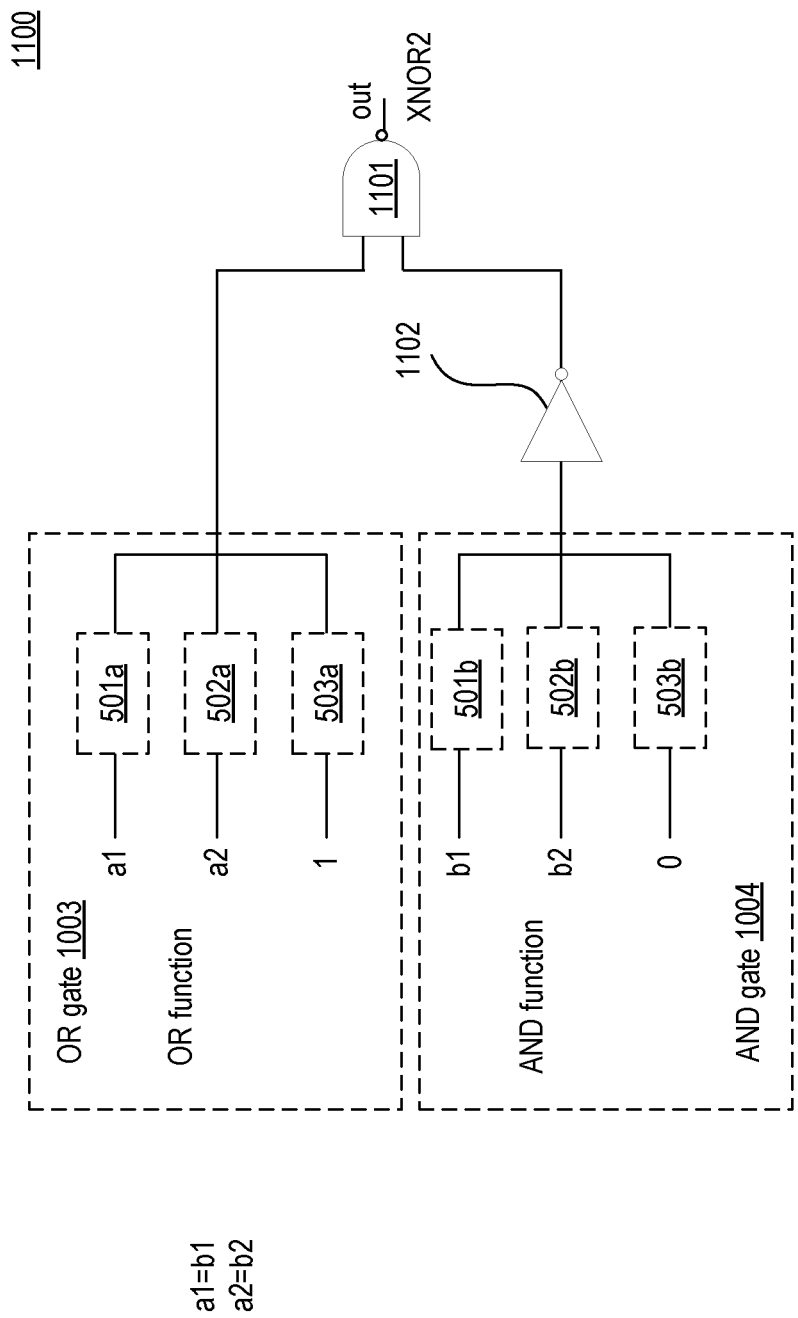
FIG. 11 is a schematic illustrating a 4-input XNOR gate comprising a 2-input OR gate as a majority gate and a 2-input AND gate as a majority gate having non-linear polar capacitors integrated with back-to-back diodes, in accordance with at least one example.

FIG. 11 is a schematic illustrating a 4-input XNOR gate 1100 comprising 2-input OR gate 1003 as a majority gate and 2-input AND gate 1004 as a majority gate having non-linear polar capacitors integrated with back-to-back diodes, in accordance with at least one example. XNOR gate 1100 further comprises NAND gate 1101 and inverter 1102. In at least one example, 2-input OR gate 1003 receives inputs a1, a2, and fixed input 1 (e.g., input tied to a power supply rail), and generates an output coupled to a first terminal of NAND gate 1101. In at least one example, 2-input AND gate 1004 receives inputs b1, b2, and fixed input 0 (e.g., input tied to a ground supply rail), and generates an output coupled to an input of inverter 1102. In at least one example, the output of inverter 1102 is coupled to a second input of NAND gate 1101. The output of NAND gate 1101 is "out" which is the XNOR function of inputs a1 and a2, where a1 and b1 receive the same input while a2 and b2 receive the same input.

FIG. 12 illustrates a flowchart 1200 of a method of forming a 3-input majority gate with non-linear input capacitors and back-to-back diodes, in accordance with at least one example. While various blocks are shown in a particular order, the order can be modified. For example, some blocks may be performed before other blocks, and some blocks may be performed simultaneously.

At block 1201, a first capacitor C1n1 is formed and configured to receive a first input a at its first terminal. In at least one example, a second terminal of the first capacitor C1n1 is coupled to a summing node Vs1. At block 1202, a first diode structure is coupled to the summing node Vs1 and the first terminal of capacitor C1n1. The first diode structure is connected in parallel to the first capacitor C1n1, in accordance with at least one example. In at least one example, the first diode structure includes a back-to-back diode arrangement (e.g., a n-p-n junction) or a Schottky diode.

At block 1203, a second capacitor C2n1 is formed and configured to receive a second input b at its first terminal. In at least one example, a second terminal of the second capacitor C2n1 is coupled to a summing node Vs1. At block 1204, a second diode structure is coupled to the summing node Vs1 and the first terminal of capacitor C2n1. The second diode structure is connected in parallel to the second capacitor C2n1, in accordance with at least one example. In at least one example, the second diode structure includes a back-to-back diode arrangement (e.g., an n-p-n junction) or a Schottky diode.

At block 1205, a third capacitor C3n1 is formed and configured to receive a second input c at its first terminal. In at least one example, a third terminal of the second capacitor C2n1 is coupled to a summing node Vs1. At block 1206, a third diode structure is coupled to the summing node Vs1 and the first terminal of capacitor C3n1. The third diode structure is connected in parallel to the third capacitor C3n1, in accordance with at least one example. In at least one example, the third diode structure includes a back-to-back diode arrangement (e.g., a n-p-n junction) or a Schottky diode. At block 1207, a driver circuitry is coupled to summing node Vs1.

Figure 13A:
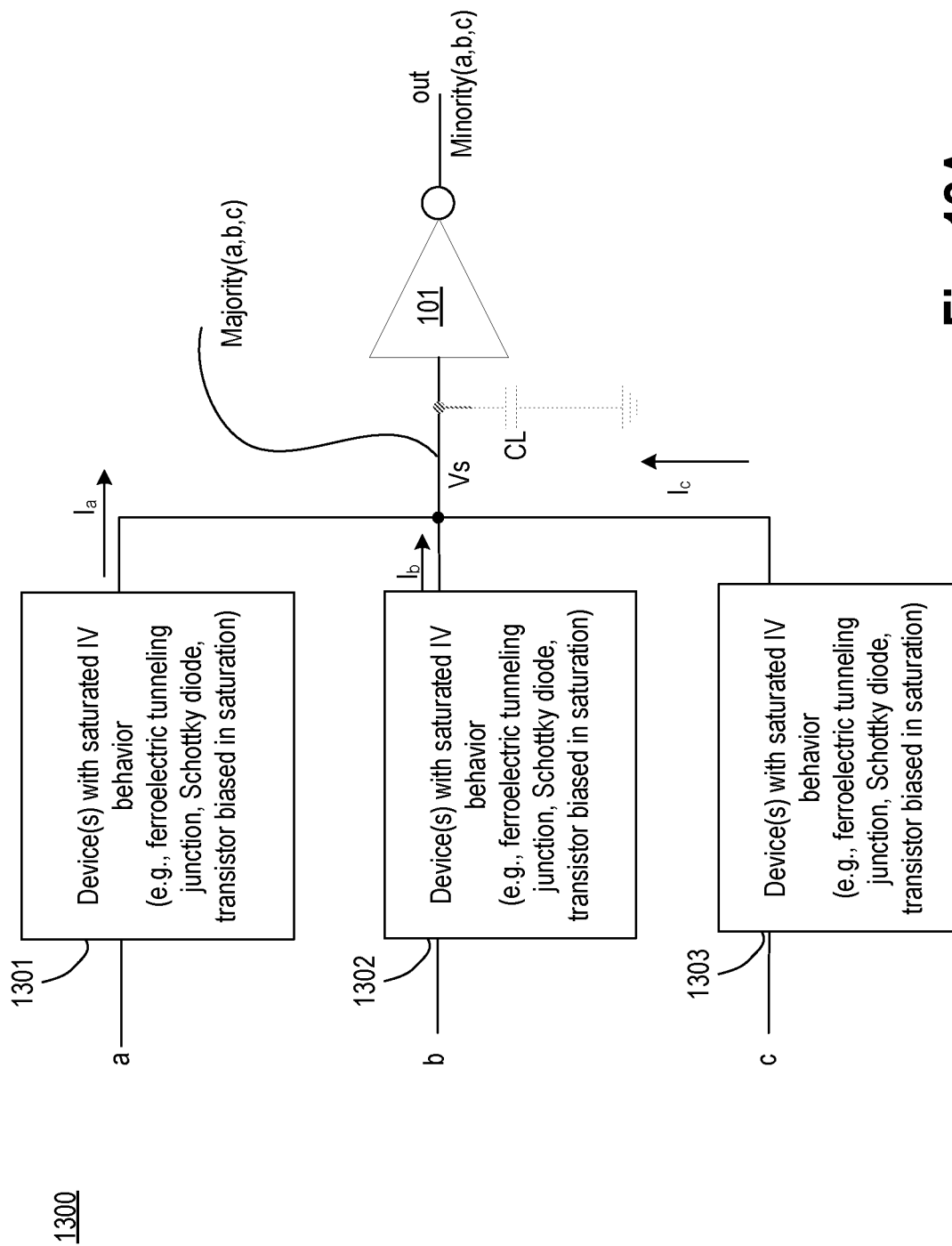
FIG. 13A-B are schematics illustrating a 3-input majority gate with devices having saturated IV behavior, in accordance with at least one example.
Figure 13B:
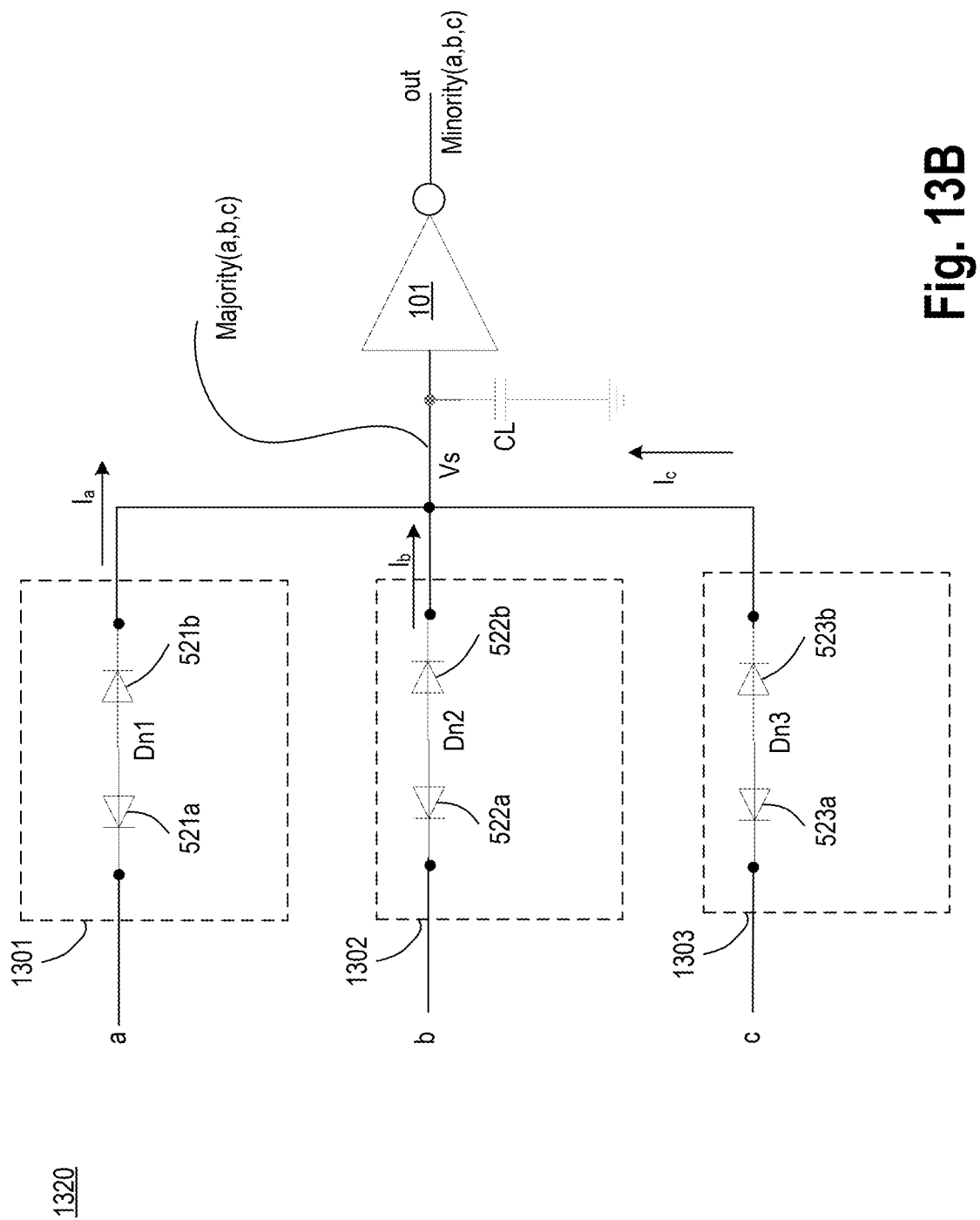

FIG. 13A-B are schematics illustrating a 3-input majority gates 1300 and 1320, respectively, with devices having saturated IV behavior, in accordance with some examples. In at least one example, instead of non-linear polar capacitors as input capacitors discussed in FIG. 5, one of more devices with saturated IV (current-voltage) behavior are used. In at least one example, first device 501 is replaced with first device 1301 which includes one of more devices with saturated IV, wherein the one or more devices has one terminal coupled to input 'a' and a second terminal coupled to summing node Vs. In at least one example, second device 502 is replaced with first device 1302 which includes one or more of devices with saturated IV, wherein the one or more devices has one terminal coupled to input 'b' and a second terminal coupled to summing node Vs. In at least one example, second device 503 is replaced with first device 1303 which includes one or more of devices with saturated IV, wherein the one or more devices has one terminal coupled to input 'c' and a second terminal coupled to summing node Vs. In least one example, the one or more devices comprises a ferroelectric tunneling junction, Schottky diode, or a transistor biased in saturation operation region. In at least one example, the one or more devices comprises back-to-back diodes as illustrated in FIG. 13B. As discussed herein, driver circuitry 101 can be an inverter or any other CMOS, or non-CMOS (e.g., ferroelectric logic, paraelectric logic) driver circuitry. The majority function on the summing node Vs is achieved by voltage division between one or more devices (e.g., 1301-1303).

Depending on the desired speed of the majority gate function, the type of the one or more devices may be selected. In at least one example, for faster majority gate function where inputs have faster switching speeds (e.g., high frequency signals), input capacitors are used with diode structures as discussed with reference to FIG. 5. In at least one example, where speed is of secondary concern and/or input signals have slower switching speeds (e.g., low frequency or DC signals), non-capacitors based one or more devices (e.g., 1301-1303) may be used. The non-capacitors based one or more devices include back-to-back diodes, Schottky diodes, devices operating in saturation region, devices with saturation IV behavior. In at least one example, circuits discussed with reference to FIGS. 8A, 8B, 8C, 8D, 8E, 8F, 9A, 9B, 9C, 9D, 10, and 11 can also be implemented using the one or more devices (e.g., 1301-1303).

Figure 14:
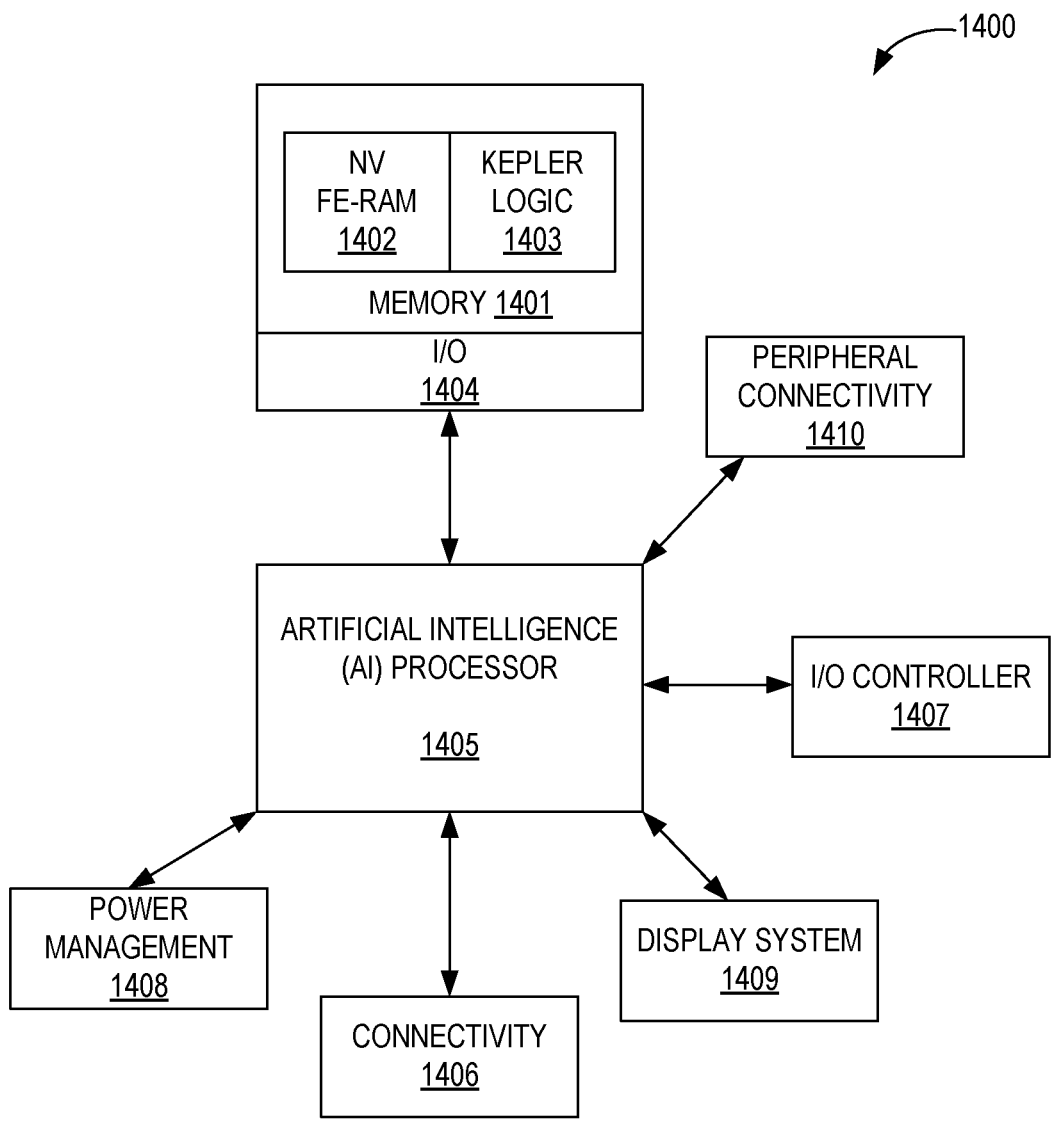
FIG. 14 is a schematic illustrating a system-on-chip (SOC) that uses the majority logic gates having non-linear polar capacitors integrated with back-to-back diodes, in accordance with at least one example.

FIG. 14 is a schematic illustrating a system-on-chip (SOC) 1400 that uses the majority logic gates having non-linear polar capacitors integrated with back-to-back diodes, in accordance with at least one example. SOC 1400 comprises memory 1401 having static random-access memory (SRAM) or FE based random access memory FE-RAM, or any other suitable memory. The memory can be non-volatile (NV) or volatile memory. Memory 1401 may also comprise logic 1403 to control memory 1402. For example, write and read drivers are part of logic 1403. These drivers and other logic are implemented using the majority gates of various examples. The logic can comprise majority or threshold gates and traditional logic (e.g., CMOS based NAND, NOR etc.).

SOC further comprises a memory I/O (input-output) interface 1404. The interface may be double-data rate (DDR) compliant interface or any other suitable interface to communicate with a processor. Processor 1405 of SOC 1400 can be a single core or multiple core processor. Processor 1405 can be a general-purpose processor (CPU), a digital signal processor (DSP), or an Application Specific Integrated Circuit (ASIC) processor. In at least one example, processor 1405 is an artificial intelligence (AI) processor (e.g., a dedicated AI processor, a graphics processor configured as an AI processor). In various embodiments, processor 1405 is a processor circuitry which is to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In at least one example, AI processor 1405 has reduced latency of computing the training model and using the training model, which reduces the power consumption of such AI processor systems.

Processor 1405 may be coupled to a number of other chiplets that can be on the same die as SOC 1400 or on separate dies. These chiplets include connectivity circuitry 1406, I/O controller 1407, power management 1408, and display system 1409, and peripheral connectivity circuitry 1410.

Connectivity circuitry 1406 represents hardware devices and software components for communicating with other devices. Connectivity circuitry 1406 may support various connectivity circuitries and standards. For example, connectivity circuitry 1406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In at least one example, connectivity circuitry 1406 may support non-cellular standards such as WiFi.

I/O controller 1407 represents hardware devices and software components related to interaction with a user. I/O controller 1407 is operable to manage hardware that is part of an audio subsystem and/or display subsystem. For example, input through a microphone or other audio device can provide input or commands for one or more applications or functions of SOC 1400. In at least one example, I/O controller 1407 illustrates a connection point for additional devices that connect to SOC 1400 through which a user might interact with the system. For example, devices that can be attached to the SOC 1400 might include microphone devices, speaker or stereo systems, video systems or other display devices, keyboard or keypad devices, or other I/O devices for use with specific applications such as card readers or other devices.

Power management 1408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logics. Power management 1408 may accordingly put such logic into low power state without the worry of losing data. Power management may select a power state according to Advanced Configuration and Power Interface (ACPI) specification for one or all components of SOC 1400.

Display system 1409 represents hardware (e.g., display devices) and software (e.g., drivers) components that provide a visual and/or tactile display for a user to interact with the processor 1405. In at least one example, display system 1409 includes a touch screen (or touch pad) device that provides both output and input to a user. Display system 1409 may include a display interface, which includes the particular screen or hardware device used to provide a display to a user. In at least one example, the display interface includes logic separate from processor 1405 to perform at least some processing related to the display.

Peripheral connectivity circuitry 1410 may represent hardware devices and/or software devices for connecting to peripheral devices such as printers, chargers, cameras, etc. Peripheral connectivity circuitry 1410 may support communication protocols, e.g., PCIe (Peripheral Component Interconnect Express), USB (Universal Serial Bus), Thunderbolt, High-Definition Multimedia Interface (HDMI), Firewire, etc.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" may generally refer to a direct connection, such as electrical, mechanical, or magnetic connection between the things that are connected, without any intermediary devices.

The term "coupled" may generally refer to a direct or indirect connection, such as a direct electrical, mechanical, or magnetic connection between the things that are connected or an indirect connection, through one or more passive or active intermediary devices.

The term "adjacent" here may generally refer to a position of a thing being next to (e.g., immediately next to or close to with one or more things between them) or adjoining another thing (e.g., abutting it).

The term "circuit" or "module" may generally refer to one or more passive and/or active components that are arranged to cooperate with one another to provide a desired function.

The term "signal" may generally refer to at least one current signal, voltage signal, magnetic signal, or data/clock signal. The meaning of "a," "an," and "the" include plural references. The meaning of "in" includes "in" and "on."

Here, the term "analog signal" may generally refer to any continuous signal for which the time varying feature (variable) of the signal is a representation of some other time varying quantity, i.e., analogous to another time varying signal.

Here, the term "digital signal" may generally refer to a physical signal that is a representation of a sequence of discrete values (a quantified discrete-time signal), for example of an arbitrary bit stream, or of a digitized (sampled and analog-digital converted) analog signal.

The term "scaling" may generally refer to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," may generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein may generally refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, "backend" or backend-of-line (BOEL) may generally refer to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of backend of die. Here, "frontend" or frontend-of-line (FEOL) may generally refer to a section of die that includes active region (e.g., where transistors are fabricated) and low-level metal layers and corresponding vias that are closer to active region (e.g., metal layer 5 and below in ten-metal stack die, for example).

Reference in the specification to "an example," "one example," "some examples," "at least one example," or "other examples" means that a particular feature, structure, or characteristic described in connection with the examples is included in at least some examples, but not necessarily all examples. The various appearances of "an example," "one example," "at least one example," or "some examples" are not necessarily all referring to the same examples. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art, in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention. For example, example 7 can be combined with example 3 or 2, or both.

Example 1 is an apparatus comprising: a first capacitor to receive a first input, the first capacitor coupled to a node; a first diode structure coupled to the first input and the node; a second capacitor to receive a second input, the second capacitor coupled to the node; and a second diode structure coupled to the second input and the node.

Example 2 is an apparatus according to any example herein, in particular example 1, wherein the apparatus further comprises a third capacitor to receive a third input, wherein the third capacitor is coupled to the node; and a third diode structure coupled to the third input and the node.

Example 3 is an apparatus according to any example herein, in particular example 2, further comprising a driver circuitry having an input coupled to the node.

Example 4 is an apparatus according to any example herein, in particular example 1, wherein the first diode structure includes: a first diode including a first cathode terminal and a first anode terminal, wherein the first cathode terminal is coupled to the first input; and a second diode including a second cathode terminal and a second anode terminal, wherein the second cathode terminal is coupled to the node, and wherein the second anode terminal is coupled to the first anode terminal.

Example 5 is an apparatus according to any example herein, in particular example 1, wherein the second diode structure includes: a third diode including a third cathode terminal and a third anode terminal, wherein the third cathode terminal is coupled to the second input; and a fourth diode including a fourth cathode terminal and a fourth anode terminal, wherein the fourth cathode terminal is coupled to the node, and wherein the fourth anode terminal is coupled to the third anode terminal.

Example 6 is an apparatus according to any example herein, in particular example 2, wherein the third diode structure includes: a fifth diode including a fifth cathode terminal and a fifth anode terminal, wherein the fifth cathode terminal is coupled to the third input; and a sixth diode including a sixth cathode terminal and a sixth anode terminal, wherein the sixth cathode terminal is coupled to the node, and wherein the sixth anode terminal is coupled to the fifth anode terminal.

Example 7 is an apparatus according to any example herein, in particular example 2, wherein the first diode structure, the second diode structure, and the third diode structure comprise a diode, an n-p-n junction, or a Schottky barrier.

Example 8 is an apparatus according to any example herein, in particular example 2, wherein the first capacitor, the second capacitor, and the third capacitor include non-linear polar material.

Example 9 is an apparatus according to any example herein, in particular example 8, wherein the non-linear polar material includes one of: a ferroelectric material, a paraelectric material, or a non-linear dielectric.

Example 10 is an apparatus according to any example herein, in particular example 9, wherein the ferroelectric material includes one of: a form ABB'O$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B" includes one of: Sc, Ti, V, Cr, Mn, Fe, Co, Ni, Cu, or Zn; a form AA'BO$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, wherein "A" includes one of Y, La, Sc, Ce, Pr, Nd, Pm, Sm, Eu, Gd, Tb, Dy, Ho, Er, T, Yb, Lu, and wherein A' comprises a valency of site A, but different ferroelectric polarizability from A; a form ABO$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, and wherein "B" includes one of Mn, Fe, Ta, or Nb; bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table; lead zirconium titanate (PZT) or PZT with a second doping material, wherein the second doping material is one of La or Nb; a perovskite material which includes one of: BaTiO$_3$, PbTiO$_3$, KNbO$_3$, KNbO$_3$, or NaTaO$_3$, wherein the perovskite material is doped with La or lanthanides, or chemically substituted lead titanate, and wherein Zr, La, or Nb is substituted in Ti site; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a BaTiO$_3$ (BTO) based relaxor which includes one of: BaTiO$_3$—Bi(Zn$_{1/2}$Ti$_{1/2}$)O$_3$ (BTO-BZT), BaTiO$_3$—BiScO$_3$ (BTO-BS): BiScO$_3$, Ba$_{(1-x)}$Sr$_x$TiO$_3$ (BST), BaTiO$_3$—Pb(Mg$_{1/3}$Nb$_{2/3}$)O$_3$ (BTO-PMN), BaTi$_{(1-x)}$Zr$_x$O$_3$ (BTZ), BaTiO$_3$—Pb(Zn$_{1/3}$Nb$_{2/3}$)O$_3$ (BTO-PZN), BaTiO$_3$—Pb(Sc$_{1/2}$Nb$_{1/2}$)O$_3$ (BTO-PSN); a PZT based relaxor which includes one of: PZT-Pb(Mg$_{1/3}$Nb$_{2/3}$)O$_3$ (PZT-PMN), PZT-Pb(Ni$_{1/3}$Nb$_{2/3}$)O$_3$ (PZT-PNN), PZT-Pb(Zn$_{1/3}$Nb$_{2/3}$)O$_3$ (PZT-PZN), PZT-Pb(Sc$_{1/2}$Nb$_{1/2}$)O$_3$ (PZT-PSN), PZT-Pb(Fe$_{1/2}$Nb$_{1/2}$)O$_3$ (PZT-PFN), PZT-Pb(La,Zr,Ti)O$_3$ (PZT-PLZT), or PZT-Pb(Ti,Mn)O$_3$ (PZT-PTM); a SrBi$_2$Ta$_2$O$_9$ (SBT) based relaxor which includes one of: paraelectric SBT-SrBi$_2$(Nb, Ta)$_2$O$_9$ (SBT-SBNT), or SBT doped with one of: Mn, Fe, Co, La, Ce or Nd, Ba, or Ca; a first hexagonal ferroelectric which includes one of: YMnO$_3$ or LuFeO$_3$; a second hexagonal ferroelectric of a type RMnO$_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); lithium niobate, lithium tantalate, lithium iron tantalum oxy fluoride, barium strontium niobate, sodium barium niobate, or potassium strontium niobate; an improper ferroelectric material which includes one of: [PTO/STO]n or [LAO/STO]n, wherein 'n' is between 1 and 100; hafnium (Hf), zirconium (Zr), aluminum (Al), Silicon (Si), their oxides, or their alloyed oxides; hafnium oxides of a form Hf$_{(1-x)}$E$_x$O$_y$, where E includes one of: Al, Ca, Ce, Dy, Er, Gd, Ge, La, Sc, Si, Sr, Sn, Zr, or Y, wherein 'x' and 'y' are first and second fractions, respectively; HfO$_2$ doped with one of: Al, Ca, Ce, Dy, Er, Gd, Ge, La, Sc, Si, Sr, Sn, or Y; Al$_{(1-x)}$Sc$_{(x)}$N, Ga$_{(1-x)}$Sc$_{(x)}$N, Al$_{(1-x)}$Y(x)N or Al$_{(1-x-y)}$Mg$_{(x)}$Nb$_{(y)}$N, wherein 'x' and 'y' are third and fourth fractions, respectively; or LiNbO$_3$, LiTaO$_3$, LiTaO$_2$F$_2$, Sr$_{(x)}$Ba$_{(1-x)}$Nb$_2$O$_6$ where $0.32 \leq x \leq 0.8$, or KSr$_2$Nb$_5$O$_{15}$; or a paraelectric material comprising SrTiO$_3$, Ba(x)Sr(y)TiO$_3$, HfZrO$_2$, Hf—Si—O, or La-substituted PbTiO$_3$.

Example 11 is an apparatus according to any example herein, in particular example 2, wherein the first input, the second input, and the third input are digital signals.

Example 12 is an apparatus according to any example herein, in particular example 3 wherein the driver circuitry comprises a CMOS gate.

Example 13 is an apparatus comprising: a set of devices coupled to a summation node, the set of devices having a non-linear leakage response that is to provide a DC resistive-majority on the summation node which compliments an AC capacitive-majority from the set of devices on the summation node.

Example 14 is an apparatus according to any example herein, in particular example 13, wherein an individual device of the set of devices includes a capacitor having non-linear polar material, and an n-p-n junction coupled in parallel to the capacitor.

Example 15 is an apparatus according to any example herein, in particular example 13, wherein the set of devices includes: a first capacitor to receive a first input, the first capacitor coupled to the summation node; a first diode structure coupled to the first input and the summation node; a second capacitor to receive a second input, the second capacitor coupled to the summation node; a second diode structure coupled to the second input and the summation node; a third capacitor to receive a third input, wherein the third capacitor is coupled to the summation node; and a third diode structure coupled to the third input and the summation node.

Example 16 is an apparatus according to any example herein, in particular example 15, wherein the first capacitor, the second capacitor, and the third capacitor provide an AC path for the AC capacitive-majority while the first diode structure, the second diode structure, and the third diode structure provide a DC path for the DC resistive-majority.

Example 17 is an apparatus according to any example herein, in particular example 15, wherein the first diode structure, the second diode structure, and the third diode structure comprise a diode, an n-p-n junction, or a Schottky barrier, and wherein the first capacitor, the second capacitor, and the third capacitor include non-linear polar material.

Example 18 is a system comprising: a processor circuitry to execute one or more instructions; a communication interface communicatively coupled to the processor circuitry; and a memory coupled to the processor circuitry, wherein the processor circuitry comprises a first capacitor to receive a first input, the first capacitor coupled to a node; a first diode structure coupled to the first input and the node; a second capacitor to receive a second input, the second capacitor coupled to the node; and a second diode structure coupled to the second input and the node.

Example 19 is a system according to any example herein, in particular example 18, wherein the processor circuitry further comprises: a third capacitor to receive a third input, wherein the third capacitor is coupled to the node; a third diode structure coupled to the third input and the node; and a driver circuitry having an input coupled to the node.

Example 20 is a system according to any example herein, in particular example 18, wherein the first diode structure includes: a first diode including a first cathode terminal and a first anode terminal, wherein the first cathode terminal is coupled to the first input; and a second diode including a second cathode terminal and a second anode terminal, wherein the second cathode terminal is coupled to the node, and wherein the second anode terminal is coupled to the first anode terminal.

Example 21 is an apparatus comprising: a set of devices coupled to a summation node, wherein the set of devices provide a capacitive majority function on the summation node over a first time scale, wherein the set of devices provide leakage to the summation node, wherein the leakage reinforces charge distribution on the summation node over a second time scale, wherein the second time scale is longer than the first time scale.

Example 22 is an apparatus according to any example herein, in particular example 21, wherein an individual device of the set of devices includes a capacitor having non-linear polar material, and an n-p-n junction coupled in parallel to the capacitor.

Example 23 is an apparatus according to any example herein, in particular example 21, wherein the first capacitor, the second capacitor, and the third capacitor provide an AC path over the first time scale, while the first diode structure, the second diode structure, and the third diode structure provide a DC path for the second time scale.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a first capacitor to receive a first input, the first capacitor coupled to a node;
a first diode structure coupled to the first input and the node;
a second capacitor to receive a second input, the second capacitor coupled to the node; and
a second diode structure coupled to the second input and the node.
2. The apparatus of claim 1, further comprising:
a third capacitor to receive a third input, wherein the third capacitor is coupled to the node; and
a third diode structure coupled to the third input and the node.
3. The apparatus of claim 2 further comprising a driver circuitry having an input coupled to the node.
4. The apparatus of claim 1, wherein the first diode structure includes:
a first diode including a first cathode terminal and a first anode terminal, wherein the first cathode terminal is coupled to the first input; and
a second diode including a second cathode terminal and a second anode terminal, wherein the second cathode terminal is coupled to the node, and wherein the second anode terminal is coupled to the first anode terminal.
5. The apparatus of claim 1, wherein the second diode structure includes:
a third diode including a third cathode terminal and a third anode terminal, wherein the third cathode terminal is coupled to the second input; and
a fourth diode including a fourth cathode terminal and a fourth anode terminal, wherein the fourth cathode terminal is coupled to the node, and wherein the fourth anode terminal is coupled to the third anode terminal.
6. The apparatus of claim 2, wherein the third diode structure includes:
a fifth diode including a fifth cathode terminal and a fifth anode terminal, wherein the fifth cathode terminal is coupled to the third input; and
a sixth diode including a sixth cathode terminal and a sixth anode terminal, wherein the sixth cathode terminal is coupled to the node, and wherein the sixth anode terminal is coupled to the fifth anode terminal.

7. The apparatus of claim 2, wherein the first diode structure, the second diode structure, and the third diode structure comprise a diode, an n-p-n junction, or a Schottky barrier.
8. The apparatus of claim 2, wherein the first capacitor, the second capacitor, and the third capacitor include non-linear polar material.
9. The apparatus of claim 8, wherein the non-linear polar material includes one of: a ferroelectric material, a paraelectric material, or a non-linear dielectric.
10. The apparatus of claim 9, wherein the ferroelectric material includes one of:
a first dielectric having a form ABB'O$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, and wherein "B'" includes one of: Sc, Ti, V, Cr, Mn, Fe, Co, Ni, Cu, or Zn;
a second dielectric having a form AA'BO$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, wherein "B" includes one of Mn, Fe, Ta, or Nb, wherein "A'" includes one of Y, La, Sc, Ce, Pr, Nd, Pm, Sm, Eu, Gd, Tb, Dy, Ho, Er, T, Yb, Lu, and wherein A' comprises a valency of site A, but different ferroelectric polarizability from A;
a third dielectric having a form ABO$_3$, wherein "A" includes one of: Ba, K, Bi, Y, La, Sc, Ce, Pr, Nd, Pm, Sm, Eu, Gd, Tb, Dy, Ho, Er, T, Yb, Lu, Li, Bi, K, or Na, and wherein "B" includes one of Mn, Fe, Ta, or Nb;
bismuth ferrite (BFO), BFO with a first doping material, wherein the first doping material is one of lanthanum, elements from lanthanide series of a periodic table, or elements of 3d, 4d, 5d, 6d, 4f, or 5f series of periodic table;
lead zirconium titanate (PZT) or PZT with a second doping material, wherein the second doping material is one of La or Nb;
a perovskite material which includes one of: BaTiO$_3$, PbTiO$_3$, KNbO$_3$, KNbO$_3$, NaTaO$_3$, wherein the perovskite material is doped with La or Lanthanides, chemically substituted lead titanate, and wherein Zr, La, or Nb is substituted in Ti site;
a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST);
a BaTiO$_3$ (BTO) based relaxor which includes one of: BaTiO$_3$—Bi(Zn$_{1/2}$Ti$_{1/2}$)O$_3$ (BTO-BZT), BaTiO$_3$—BiScO$_3$ (BTO-BS): BiScO$_3$, Ba$_{(1-x)}$Sr$_x$TiO$_3$ (BST), BaTiO$_3$—Pb(Mg$_{1/3}$Nb$_{2/3}$)O$_3$ (BTO-PMN), BaTi$_{(1-x)}$Zr$_x$O$_3$ (BTZ), BaTiO$_3$—Pb(Zn$_{1/3}$Nb$_{2/3}$)O$_3$ (BTO-PZN), BaTiO$_3$—Pb(Sc$_{1/2}$Nb$_{1/2}$)O$_3$ (BTO-PSN);
a PZT based relaxor which includes one of: PZT-Pb(Mg$_{1/3}$Nb$_{2/3}$)O$_3$ (PZT-PMN), PZT-Pb(Ni$_{1/3}$Nb$_{2/3}$)O$_3$ (PZT-PNN), PZT-Pb(Zn$_{1/3}$Nb$_{2/3}$)O$_3$ (PZT-PZN), PZT-Pb(Sc$_{1/2}$Nb$_{1/2}$)O$_3$ (PZT-PSN), PZT-Pb(Fe$_{1/2}$Nb$_{1/2}$)O$_3$ (PZT-PFN), PZT-Pb(La,Zr,Ti)O$_3$ (PZT-PLZT), or PZT-Pb(Ti,Mn)O$_3$ (PZT-PTM);
a SrBi$_2$Ta$_2$O$_9$ (SBT) based relaxor which includes one of: paraelectric SBT-SrBi$_2$(Nb,Ta)$_2$O$_9$ (SBT-SBNT), or SBT doped with one of: Mn, Fe, Co, La, Ce or Nd, Ba, or Ca;

a first hexagonal ferroelectric which includes one of: YMnO$_3$ or LuFeO$_3$;

a second hexagonal ferroelectric of a type RMnO$_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

lithium niobate, lithium tantalate, lithium iron tantalum oxy fluoride, barium strontium niobate, sodium barium niobate, or potassium strontium niobate;

an improper ferroelectric material which includes one of: [PTO/STO]n or [LAO/STO]n, wherein 'n' is between 1 and 100;

Hafnium (Hf), Zirconium (Zr), Aluminum (Al), Silicon (Si), their oxides or their alloyed oxides;

Hafnium oxides of a form Hf$_{(1-x)}$E$_x$O$_y$, where E includes one of: Al, Ca, Ce, Dy, Er, Gd, Ge, La, Sc, Si, Sr, Sn, Zr, or Y, wherein 'x' and 'y' are first and second fractions, respectively;

HfO$_2$ doped with one of: Al, Ca, Ce, Dy, Er, Gd, Ge, La, Sc, Si, Sr, Sn, or Y;

Al$_{(1-x)}$Sc$_{(x)}$N, Ga$_{(1-x)}$Sc$_{(x)}$N, Al$_{(1-x)}$Y(x)N or Al$_{(1-x-y)}$Mg$_{(x)}$Nb$_{(y)}$N, wherein 'x' and 'y' are third and fourth fractions, respectively; or LiNbO$_3$, LiTaO$_3$, LiTaO$_2$F$_2$, Sr$_{(x)}$Ba$_{(1-x)}$Nb$_2$O$_6$ where 0.32≤x≤0.8, or KSr$_2$Nb$_5$O$_{15}$; or a paraelectric material comprising SrTiO$_3$, Ba$_{(x)}$Sr$_{(y)}$TiO$_3$, HfZrO$_2$, Hf—Si—O, or La-substituted PbTiO$_3$.

11. The apparatus of claim 2, wherein the first input, the second input, and the third input are digital signals.

12. The apparatus of claim 3 wherein the driver circuitry comprises a CMOS gate.

13. An apparatus comprising:
a set of devices coupled to a summation node, wherein the set of devices provide a capacitive majority function on the summation node over a first time scale, wherein the set of devices provide leakage to the summation node, wherein the leakage reinforces charge distribution on the summation node over a second time scale, and wherein the second time scale is longer than the first time scale.

14. The apparatus of claim 13, wherein an individual device of the set of devices includes a capacitor having a non-linear polar material, and an n-p-n junction coupled in parallel to the capacitor.

15. The apparatus of claim 13, wherein the set of devices includes:
a first capacitor to receive a first input, the first capacitor coupled to the summation node;

a first diode structure coupled to the first input and the summation node;
a second capacitor to receive a second input, the second capacitor coupled to the summation node;
a second diode structure coupled to the second input and the summation node;
a third capacitor to receive a third input, wherein the third capacitor is coupled to the summation node; and
a third diode structure coupled to the third input and the summation node.

16. The apparatus of claim 15, wherein the first capacitor, the second capacitor, and the third capacitor provide an AC path over the first time scale, while the first diode structure, the second diode structure, and the third diode structure provide a DC path for the second time scale.

17. The apparatus of claim 15, wherein the first diode structure, the second diode structure, and the third diode structure comprise a diode, an n-p-n junction, or a Schottky barrier, and wherein the first capacitor, the second capacitor, and the third capacitor include non-linear polar material.

18. A system comprising:
a processor circuitry to execute one or more instructions;
a communication interface communicatively coupled to the processor circuitry; and
a memory coupled to the processor circuitry, wherein the processor circuitry comprises:
a first capacitor to receive a first input, the first capacitor coupled to a node;
a first diode structure coupled to the first input and the node;
a second capacitor to receive a second input, the second capacitor coupled to the node; and
a second diode structure coupled to the second input and the node.

19. The system of claim 18, wherein the processor circuitry further comprises:
a third capacitor to receive a third input, wherein the third capacitor is coupled to the node;
a third diode structure coupled to the third input and the node; and
a driver circuitry having an input coupled to the node.

20. The system of claim 18, wherein the first diode structure includes:
a first diode including a first cathode terminal and a first anode terminal, wherein the first cathode terminal is coupled to the first input; and
a second diode including a second cathode terminal and a second anode terminal, wherein the second cathode terminal is coupled to the node, and wherein the second anode terminal is coupled to the first anode terminal.

* * * * *